(12) United States Patent
Chang et al.

(10) Patent No.: US 12,538,771 B2
(45) Date of Patent: Jan. 27, 2026

(54) BARRIER LAYER FOR AN INTERCONNECT STRUCTURE

(71) Applicant: Taiwan Semiconductor Manufacturing Company, Ltd., Hsinchu (TW)

(72) Inventors: Chien Chang, Hsinchu (TW); Min-Hsiu Hung, Tainan (TW); Yu-Hsiang Liao, Hsinchu (TW); Yu-Shiuan Wang, Taipei (TW); Tai Min Chang, Taipei (TW); Kan-Ju Lin, Kaohsiung (TW); Chih-Shiun Chou, Hsinchu (TW); Hung-Yi Huang, Hsin-chu (TW); Chih-Wei Chang, Hsin-Chu (TW); Ming-Hsing Tsai, Chu-Pei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 551 days.

(21) Appl. No.: 17/658,901

(22) Filed: Apr. 12, 2022

(65) Prior Publication Data
US 2023/0008239 A1   Jan. 12, 2023

Related U.S. Application Data

(60) Provisional application No. 63/220,265, filed on Jul. 9, 2021.

(51) Int. Cl.
*H01L 21/768* (2006.01)
*H01L 23/532* (2006.01)
*H01L 23/535* (2006.01)

(52) U.S. Cl.
CPC .. *H01L 21/76846* (2013.01); *H01L 21/76805* (2013.01); *H01L 21/76849* (2013.01);
(Continued)

(58) Field of Classification Search
None
See application file for complete search history.

(56) References Cited

U.S. PATENT DOCUMENTS 11,232,945 B2   1/2022   Chang et al.
11,295,956 B2   4/2022   Chang et al.
(Continued)

FOREIGN PATENT DOCUMENTS

TW   201925525 A   7/2019
TW   202004872 A   1/2020

*Primary Examiner* — Xiaoming Liu
(74) *Attorney, Agent, or Firm* — Harrity & Harrity, LLP

(57) ABSTRACT

A barrier layer is formed in a portion of a thickness of sidewalls in a recess prior to formation of an interconnect structure in the recess. The barrier layer is formed in the portion of the thickness of the sidewalls by a plasma-based deposition operation, in which a precursor reacts with a silicon-rich surface to form the barrier layer. The barrier layer is formed in the portion of the thickness of the sidewalls in that the precursor consumes a portion of the silicon-rich surface of the sidewalls as a result of the plasma treatment. This enables the barrier layer to be formed in a manner in which the cross-sectional width reduction in the recess from the barrier layer is minimized while enabling the barrier layer to be used to promote adhesion in the recess.

20 Claims, 24 Drawing Sheets

(52) U.S. Cl.
CPC .. *H01L 21/76865* (2013.01); *H01L 21/76895* (2013.01); *H01L 23/53252* (2013.01); *H01L 23/535* (2013.01)

(56) References Cited

U.S. PATENT DOCUMENTS

| | | | | |
|---|---|---|---|---|
| 2002/0187261 | A1* | 12/2002 | Pyo | H01L 21/76856 |
| | | | | 257/E21.171 |
| 2003/0072884 | A1* | 4/2003 | Zhang | C23C 16/56 |
| | | | | 427/535 |
| 2006/0194430 | A1* | 8/2006 | Beck | H01L 21/76838 |
| | | | | 257/E21.582 |
| 2015/0028490 | A1* | 1/2015 | Shao | H01L 21/76847 |
| | | | | 257/774 |
| 2018/0053721 | A1* | 2/2018 | Adusumilli | H01L 21/76804 |
| 2018/0261546 | A1* | 9/2018 | Bark | H01L 21/76856 |
| 2019/0164747 | A1* | 5/2019 | Chang | H01L 21/02274 |
| 2020/0144073 | A1* | 5/2020 | Kuratomi | C23C 16/34 |

\* cited by examiner

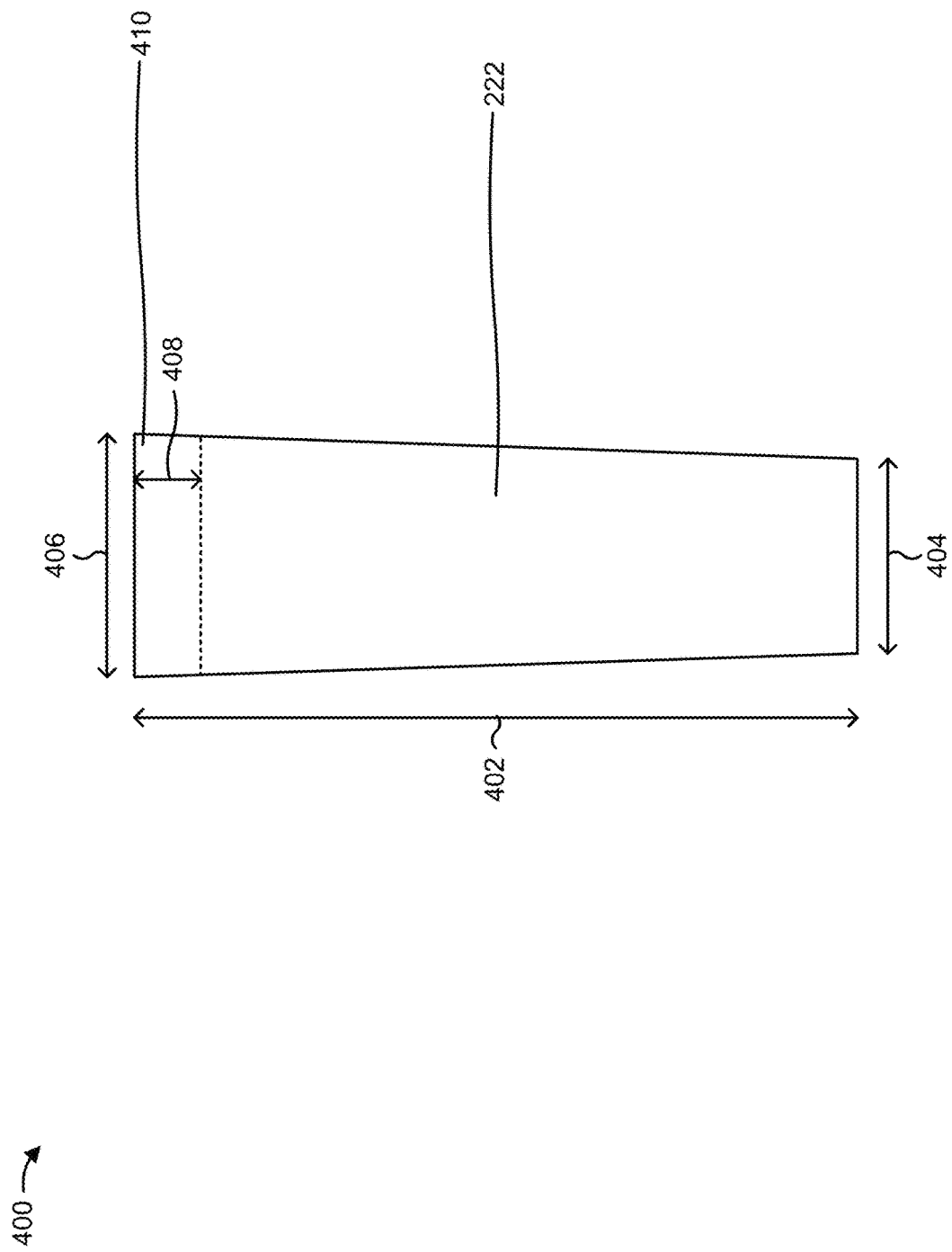

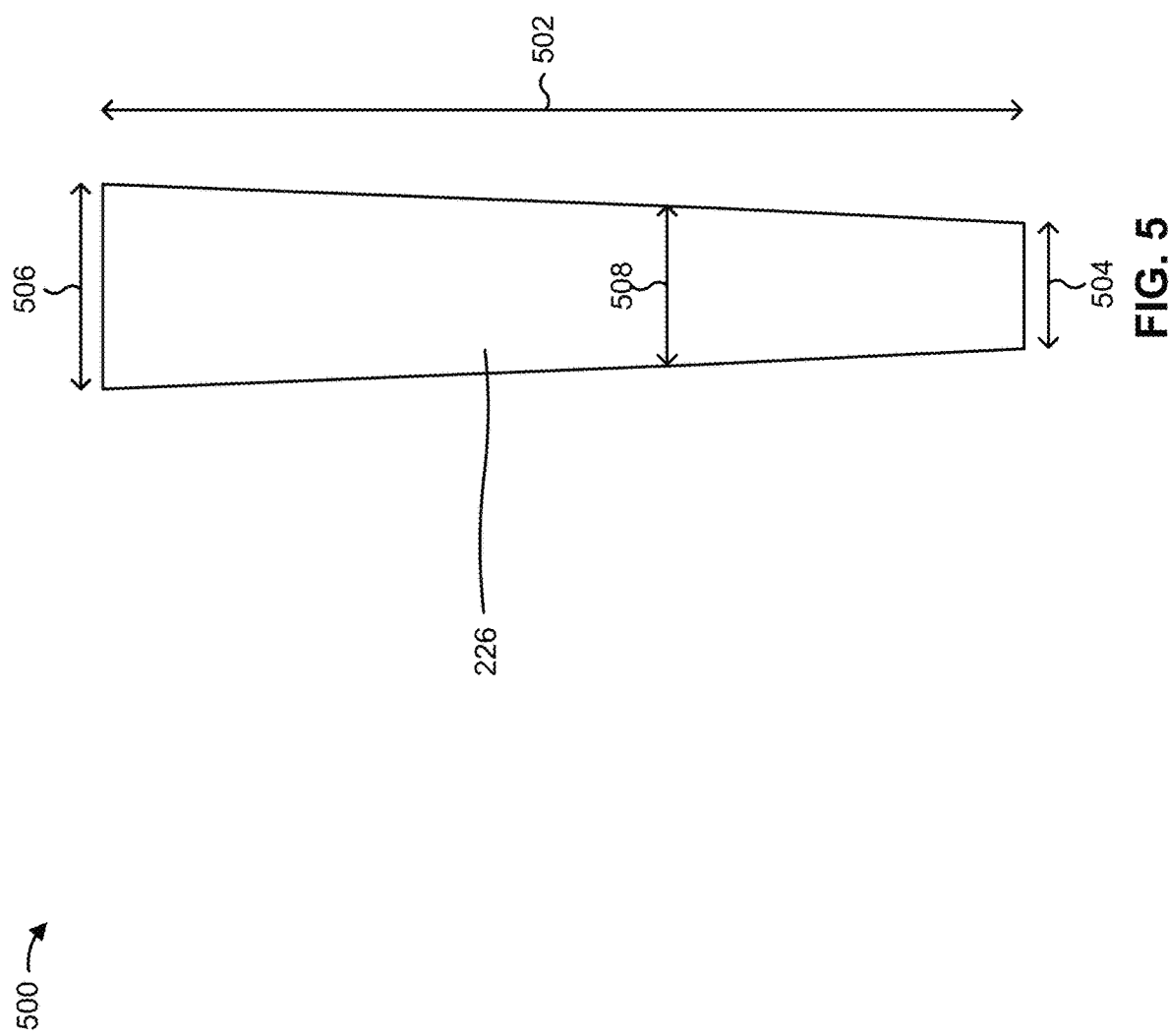

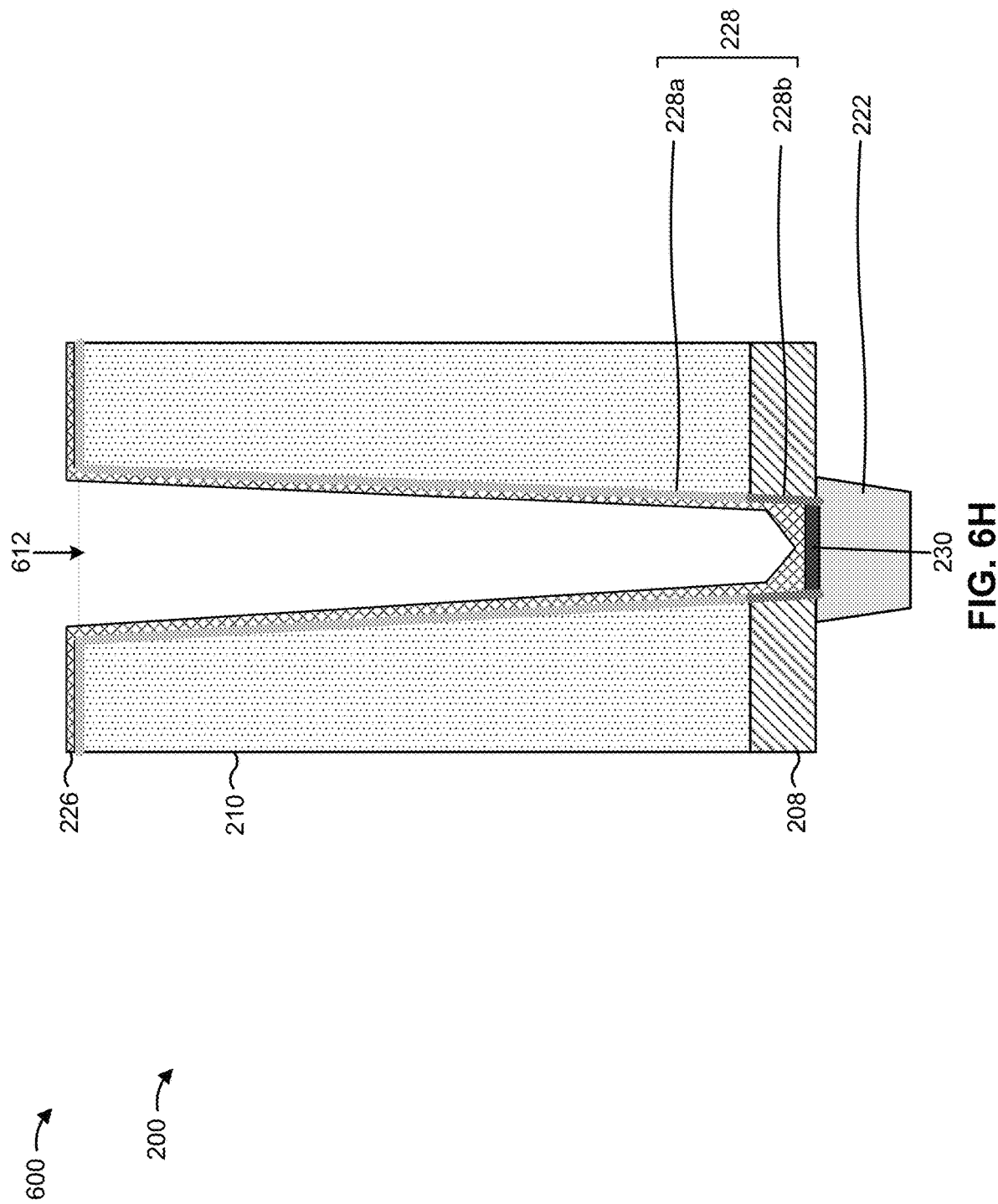

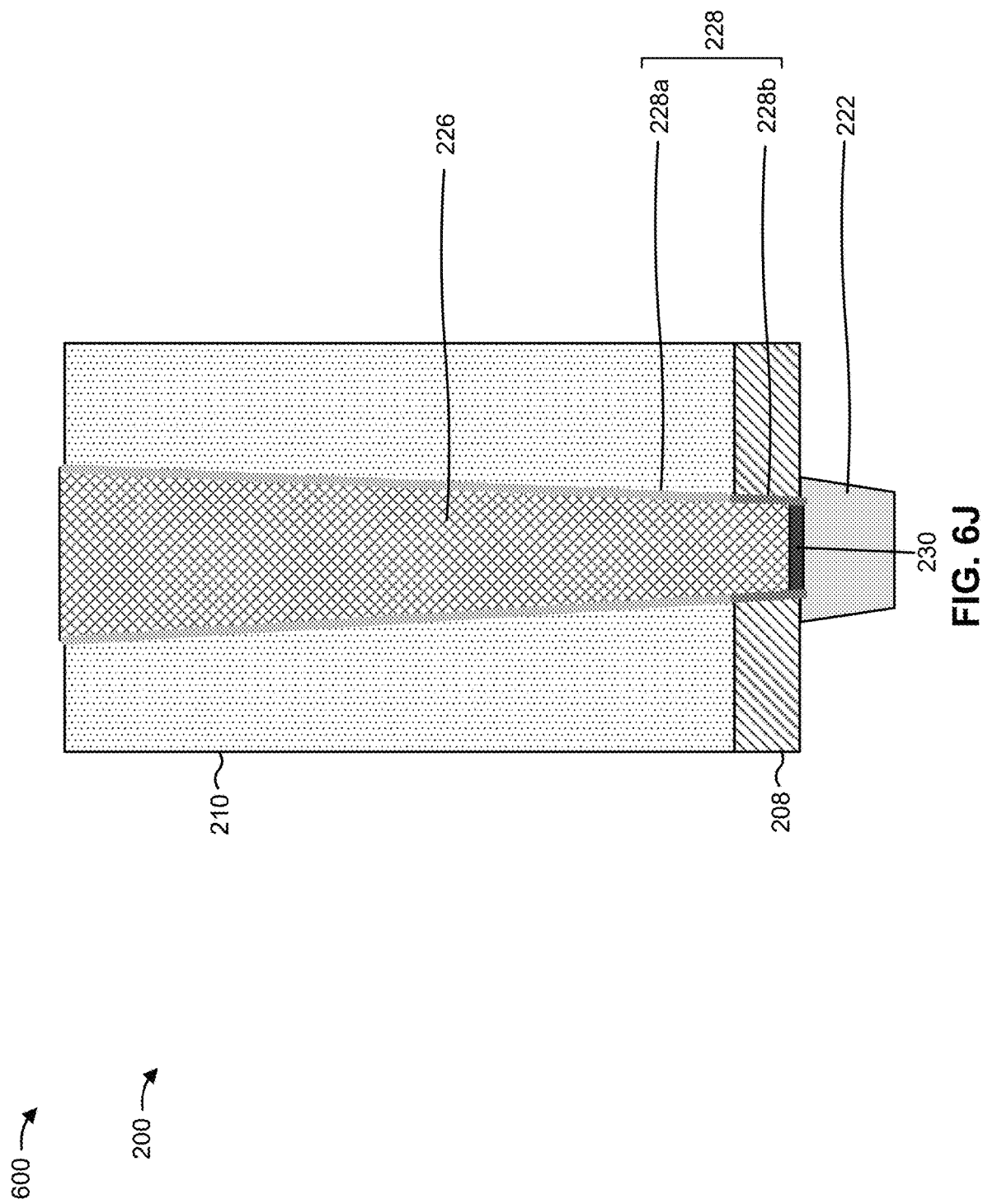

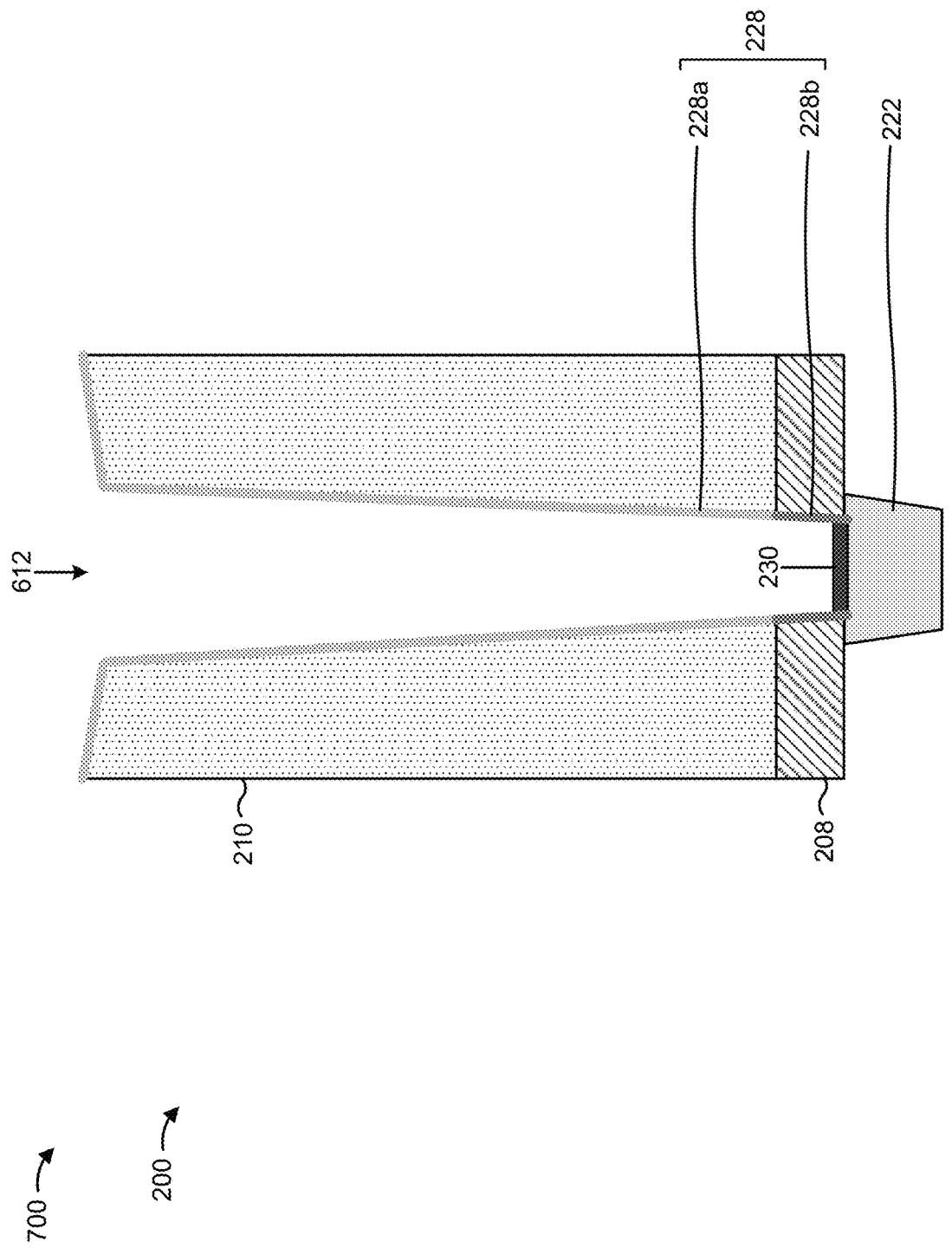

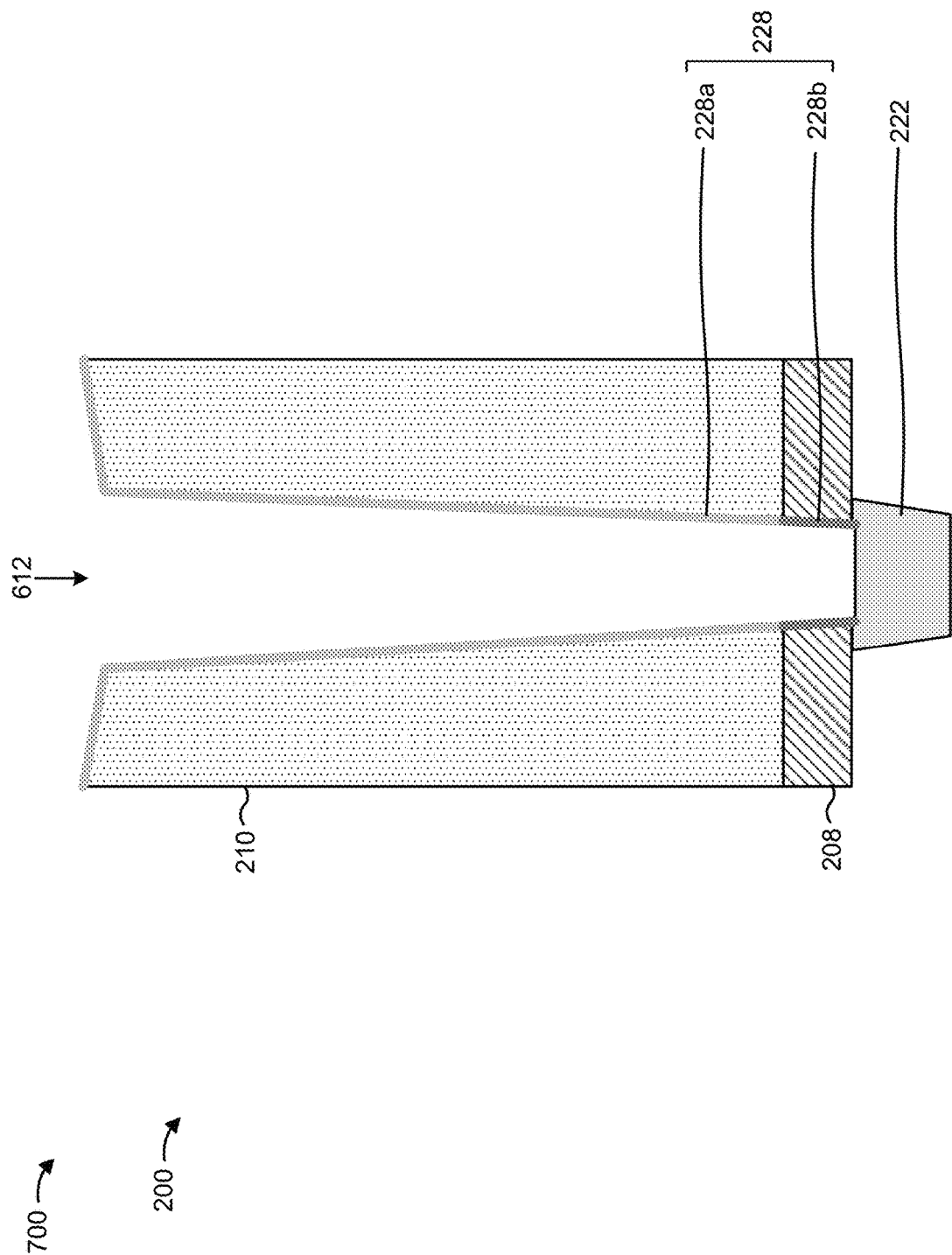

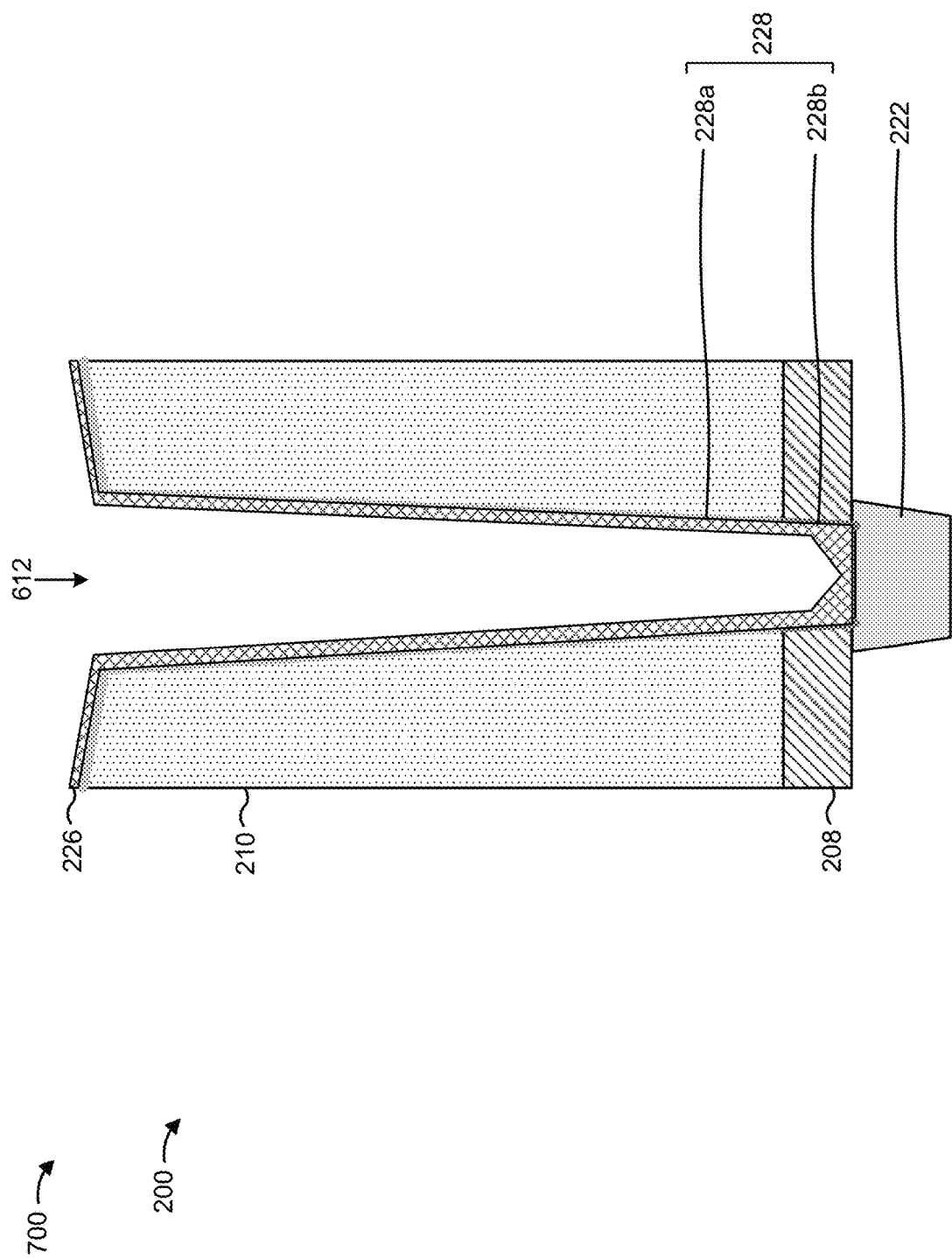

BARRIER LAYER FOR AN INTERCONNECT STRUCTURE

CROSS-REFERENCE TO RELATED APPLICATION

This Patent Application claims priority to U.S. Provisional Patent Application No. 63/220,265, filed on Jul. 9, 2021, and entitled "BARRIER LAYER FOR AN INTERCONNECT STRUCTURE." The disclosure of the prior application is considered part of and is incorporated by reference into this patent application.

BACKGROUND

An electronic device (e.g., a processor, a memory) may include various intermediate and backend layers or regions in which individual semiconductor devices (e.g., transistors, capacitors, resistors) are interconnected by interconnect structures. The interconnect structures may include metallization layers (also referred to as wires), vias that connect the metallization layers, contact plugs, and/or trenches, among other examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3-5 are diagrams of example implementations of semiconductor structures described herein.

FIGS. 6A-6J and 7A-7E are diagrams of example implementations described herein.

DETAILED DESCRIPTION

Figure 1:
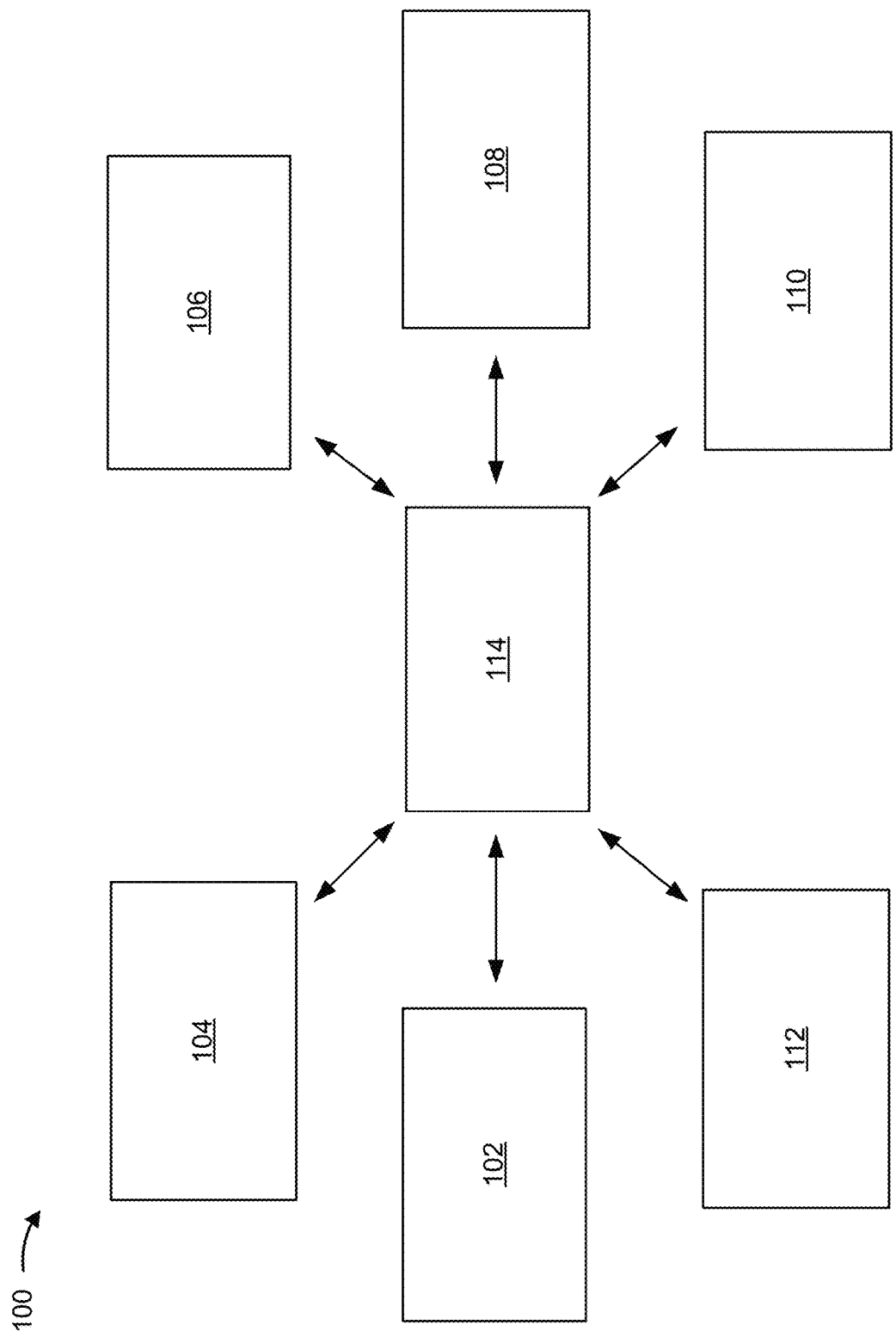
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A density of semiconductor devices in an integrated circuit may be increased to facilitate increases in complexity and/or capability for the integrated circuit device. An increased semiconductor device density leads to the structures of the semiconductor devices and/or the structures associated with the semiconductor devices being reduced in size, which includes reductions in the size of interconnect structures associated with the semiconductor devices. An interconnect structure may be formed in a recess in one or more dielectric layers of an integrated circuit device. Forming an interconnect structure becomes more difficult as the diameter or cross-sectional dimension of the recess is reduced to facilitate a reduction in size for the interconnect structure. For example, the processes used to form the interconnect structure may result in poor sidewall adhesion and void formation for the interconnect structure. These can lead to device failures, reduced device performance, and/or reduced yield, among other examples. Moreover, the use of a barrier layer to promote sidewall adhesion may reduce the width (e.g., the "critical dimension" or CD) in the recess for forming the interconnect structure, which may reduce the recess-filling performance for the interconnect structure and may increase contact resistance for the interconnect structure.

Some implementations described herein provide integrated circuit devices and methods of forming the same. In some implementations described herein, a barrier layer is formed in a portion of a thickness of sidewalls in a recess prior to formation of an interconnect structure in the recess. The barrier layer is formed in the portion of the thickness of the sidewalls by a plasma-based deposition operation. In the plasma-based deposition operation, a precursor is provided onto a surface of the sidewalls. A plasma is used to cause a diffusion of silicon (Si) in the sidewalls toward the surface of the sidewalls to create a silicon-rich surface on the sidewalls. The precursor reacts with the silicon-rich surface to form the barrier layer. The barrier layer is formed in the portion of the thickness of the sidewalls in that the precursor consumes a portion of the silicon-rich surface of the sidewalls as a result of the plasma treatment. In other words, the barrier layer is formed in a portion of the sidewalls as opposed to the barrier layer being grown on top of the surface of the sidewalls. This enables the barrier layer to be formed in a manner in which the cross-sectional width reduction in the recess from the barrier layer is minimized while enabling the barrier layer to be used to promote adhesion in the recess. This reduces roughness of the interconnect structure that is formed over the barrier layer in the recess, reduces contact resistance for the interconnect structure, increases device performance, increases yield, reduces defects, and/or reduces device failures, among other examples.

FIG. 1 is a diagram of an example environment 100 in which systems and/or methods described herein may be implemented. As shown in FIG. 1, environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The wafer/die transport tool 114 includes a mobile robot, a robot arm, a tram or rail car, an overhead hoist transport (OHT) system, an automated materially handling system (AMHS), and/or another type of device that is used to transport wafers and/or dies between semiconductor processing tools 102-112 and/or to and from other locations such as a wafer rack, a storage room, and/or the like. In some implementations, the wafer/die transport tool 114 may be a programmed device that is configured to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
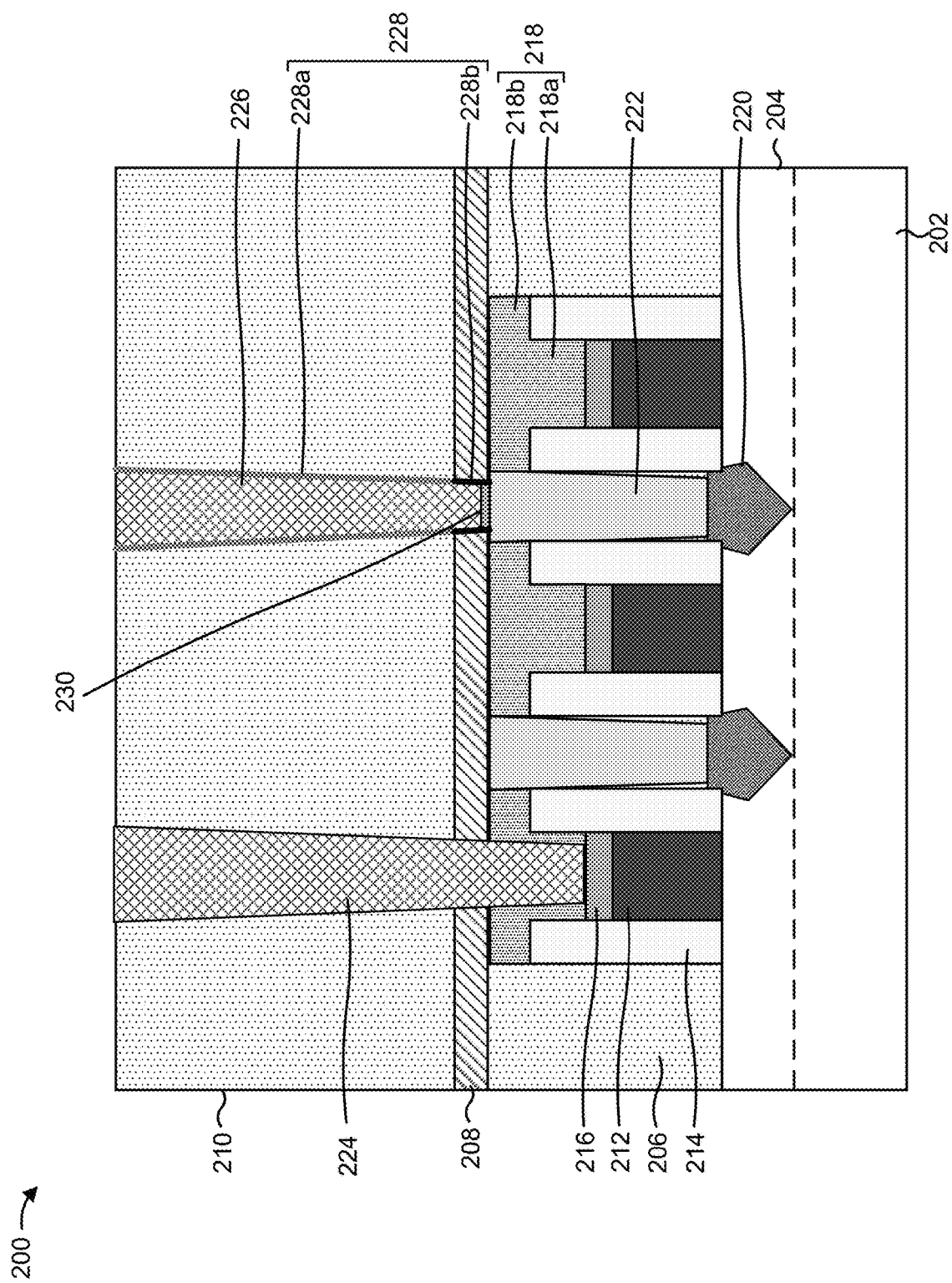
FIG. 2 is a diagram of an example of a portion of a semiconductor device described herein.

FIG. 2 is a diagram of a portion of a semiconductor device 200 described herein. The portion of the semiconductor device 200 includes an example of a memory device (e.g., a static random access memory (SRAM), a dynamic random access memory (DRAM)), a logic device, a processor, a ring oscillator (RO) device, an input/output (I/O) device, or another type of semiconductor device that includes one or more transistors.

As shown in FIG. 2, the semiconductor device 200 includes a device substrate 202, which includes a silicon (Si) substrate, a substrate formed of a material including silicon, a III-V compound semiconductor material substrate such as gallium arsenide (GaAs), a silicon on insulator (SOI) substrate, a silicon germanium (SiGe) substrate, or another type of semiconductor substrate. In some implementations, a fin structure 204 is formed in the device substrate 202. In some implementations, a plurality of fin structures 204 are included in the device substrate 202. In this way, the transistors included on the semiconductor device 200 include fin field-effect transistors (finFETs). In some implementations, the semiconductor device 200 includes other types of transistors, such as gate all around (GAA) transistors (e.g., nanosheet transistors, nanowire transistors, nanostructure transistors), planar transistors, and/or other types of transistors. The fin structures 204 are electrically isolated by intervening shallow trench isolation (STI) structures or regions (not shown). The STI structures may be etched back such that the height of the STI structures is less than the height of the fin structures 204. In this way, the gate structures of the transistors may be formed around at least three sides of the fin structures 204.

As shown in FIG. 2, a plurality of layers are included on the device substrate 202 and/or on the fin structures 204, including a dielectric layer 206, an etch stop layer (ESL) 208, and a dielectric layer 210, among other examples. The dielectric layers 206 and 210 are included to electrically isolate various structures of the semiconductor device 200. The dielectric layers 206 and 210 include interlayer dielectric layers (ILDs). For example, the dielectric layer 206 may include an ILD0 layer, and the dielectric layer 210 may include an ILD1 layer or an ILD2 layer (in some cases, the ILD1 layer is skipped).

The thickness of the dielectric layer 210 may be included in a range of approximately 3 nanometers to approximately 40 nanometers to provide sufficient height or depth for forming the interconnect structures of the semiconductor device 200 without unduly increasing the height of the semiconductor device 200. However, other values for the thickness of the ESL 208 are within the scope of the present disclosure. The dielectric layers 206 and 210 each include (e.g., either the same material or different materials) a lanthanum oxide ($La_xO_y$), an aluminum oxide ($Al_xO_y$), a yttrium oxide ($Y_xO_y$), a tantalum carbon nitride (TaCN), a zirconium silicide ($ZrSi_x$), a silicon oxycarbonitride (SiOCN), a silicon oxycarbide (SiOC), a silicon carbon nitride (SiCN), a zirconium nitride (ZrN), a zirconium aluminum oxide (ZrAlO), a titanium oxide ($Ti_xO_y$), a tantalum oxide ($Ta_xO_y$), a zirconium oxide ($Zr_xO_y$), a hafnium oxide ($Hf_xO_y$), a silicon nitride ($Si_xN_y$), a hafnium silicide ($HfSi_x$), an aluminum oxynitride (AlON), a silicon oxide ($Si_xO_y$), a silicon carbide (SiC), a zinc oxide ($Zn_xO_y$), and/or another dielectric material.

The thickness of the ESL 208 may be included in a range of approximately 3 nanometers to approximately 20 nanometers to provide sufficient etch selectivity without unduly increasing the height of the semiconductor device 200. However, other values for the thickness of the ESL 208 are within the scope of the present disclosure. The ESL 208 includes a layer of material that is configured to permit various portions of the semiconductor device 200 (or the layers included therein) to be selectively etched or protected from etching to form one or more of the structures included on the device substrate 202. The ESL 208 may include a lanthanum oxide ($La_xO_y$), an aluminum oxide ($Al_xO_y$), a yttrium oxide ($Y_xO_y$), a tantalum carbon nitride (TaCN), a zirconium silicide ($ZrSi_x$), a silicon oxycarbonitride (SiOCN), a silicon oxycarbide (SiOC), a silicon carbon nitride (SiCN), a zirconium nitride (ZrN), a zirconium aluminum oxide (ZrAlO), a titanium oxide ($Ti_xO_y$), a tantalum oxide ($Ta_xO_y$), a zirconium oxide ($Zr_xO_y$), a hafnium oxide ($Hf_xO_y$), a silicon nitride ($Si_xN_y$), a hafnium silicide ($HfSi_x$), an aluminum oxynitride (AlON), a silicon oxide ($Si_xO_y$), a silicon carbide (SiC), and/or a zinc oxide ($Zn_xO_y$), among other examples.

As further shown in FIG. 2, a plurality of gate stacks may be included over, on, and/or around a portion of the fin structure 204. The gate stacks include a metal gate (MG) structure 212 between sidewall spacers 214, a metal capping layer 216 over and/or on the metal gate structure 212, and a dielectric capping layer 218 over and/or on the metal capping layer 216. The metal gate structures 212 include a conductive metallic material (or metal alloy) such as cobalt (Co), tungsten (W), ruthenium (Ru), molybdenum (Mo), titanium (Ti), titanium nitride (TiN), another metallic material, and/or a combination thereof. The sidewall spacers 214 are included to electrically isolate the gate stacks from adjacent conductive structures included on the semiconductor device 200, and thus may be referred to as gate spacers. The sidewall spacers 214 include a silicon oxide ($SiO_x$), a silicon nitride ($Si_xN_y$), a silicon oxy carbide (SiOC), a silicon oxycarbonitride (SiOCN), and/or another suitable material.

The metal capping layer 216 is included to protect the metal gate structure 212 from oxidization and/or etch damage during processing of the semiconductor device 200, which preserves the low contact resistance of the metal gate structure 212. The metal capping layer 216 include a conductive metallic material (or metal alloy) such as cobalt (Co), tungsten (W), ruthenium (Ru), molybdenum (Mo), titanium (Ti), titanium nitride (TiN), another metallic material, and/or a combination thereof. The dielectric capping layer 218 includes a dielectric material such as a lanthanum oxide ($La_xO_y$), an aluminum oxide ($Al_xO_y$), a yttrium oxide ($Y_xO_y$), a tantalum carbon nitride (TaCN), a zirconium silicide ($ZrSi_x$), a silicon oxycarbonitride (SiOCN), a silicon oxycarbide (SiOC), a silicon carbon nitride (SiCN), a zirconium nitride (ZrN), a zirconium aluminum oxide (ZrAlO), a titanium oxide ($Ti_xO_y$), a tantalum oxide ($Ta_xO_y$), a zirconium oxide ($Zr_xO_y$), a hafnium oxide ($Hf_xO_y$), a silicon nitride ($Si_xN_y$), a hafnium silicide ($HfSi_x$), an aluminum oxynitride (AlON), a silicon oxide ($Si_xO_y$), a silicon carbide (SiC), and/or a zinc oxide ($Zn_xO_y$), among other examples.

The dielectric capping layer 218 may be referred to as a sacrificial (SAC) layer that protects the gate stacks from processing damage during processing of the semiconductor device 200. In some implementations, the dielectric capping layer 218 includes a first portion 218a (e.g., a lower portion) between a pair of sidewall spacers 214, where the first portion 218a extends from a top surface of an associated metal capping layer 216 to the same approximately height or top surface level of the sidewall spacers 214. In these implementations, the dielectric capping layer 218 further includes a second portion 218b (e.g., an upper portion) that extends above the first portion 218a and over the top surfaces of the sidewall spacers 214, as shown in FIG. 2. In some other implementations, the sidewall spacers 214 fully extend between the fin structure 204 (or the device substrate 202) and the ESL 208, and the dielectric capping layer 218 is fully contained between the sidewall spacers 214 between the top surface of the associated metal capping layer 216 and the bottom surface of the ESL 208.

As further shown in FIG. 2, a plurality of source/drain regions 220 are included on and/or around portions of the fin structure 204. The source/drain regions 220 include p-doped and/or n-doped epitaxial (epi) regions that are grown and/or otherwise formed by epitaxial growth. In some implementations, the source/drain regions 220 are formed over etched portions of the fin structure 204. The etched portions may be formed by strained source drain (SSD) etching of the fin structure 204 and/or another type etching operation.

Metal source/drain contacts (MDs) 222 are included over and/or on the source/drain regions 220. In some implementations, a metal silicide layer (not shown) is included between the source/drain regions 220 and the metal source/drain contacts 222 due to a reaction between the source/drain regions 220 and the metal source/drain contacts 222. The metal silicide layer may be included to decrease contact resistance between the source/drain regions 220 and the metal source/drain contacts 222 and/or to decrease the Schottky barrier height (SBH) between the source/drain regions 220 and the metal source/drain contacts 222. The metal source/drain contacts 222 include conductive metallic material (or metal alloy) such as cobalt (Co), tungsten (W), ruthenium (Ru), copper (Cu), another metallic material, and/or a combination thereof.

In some implementations, a contact etch stop layer (CESL) is included between the sidewall spacers of the gate stacks and the metal source/drain contacts 222. The CESL may be included to provide etch selectivity or etch stop point for the sidewall spacers 214 during an etch operation to form openings in which the metal source/drain contacts 222 are formed.

As further shown in FIG. 2, the metal gate structures 212 (e.g., either directly or via the metal capping layer 216) and the metal source/drain contacts 222 are electrically and/or physically connected to interconnect structures. For example, a metal gate structure 212 may be electrically connected to a gate interconnect structure 224 (e.g., a gate via, via-to-gate, or VG). The metal gate structure 212 is electrically and/or physically connected to the gate interconnect structure 224 directly, via the intervening metal capping layer 216, and/or by a metal gate contact (MP). As another example, a metal source/drain contact 222 are electrically and/or physically connected to a source/drain interconnect structure 226 (e.g., a source/drain via, via-to-source/drain, or VD).

The interconnect structures (e.g., the gate interconnect structure 224, the source/drain interconnect structure 226, among other examples) electrically connect the transistors on the semiconductor device 200 and/or electrically connect the transistors to other areas and/or components of the semiconductor device 200. In some implementations, the interconnect structures electrically connect the transistors to a back end of line (BEOL) region of the semiconductor device 200. The gate interconnect structure 224 and the source/drain interconnect structure 226 include a conductive material such as tungsten, cobalt, ruthenium, copper, and/or another type of conductive material. The gate interconnect structure 224 includes a conductive material such as tungsten (W), ruthenium (Ru), molybdenum (Mo), cobalt (Co), copper (Cu), titanium (Ti), aluminum (Al), another conductive material, a conductive material composition, or a combination thereof. The source/drain interconnect structure 226 includes a conductive material such as tungsten (W), ruthenium (Ru), molybdenum (Mo), cobalt (Co), copper (Cu), titanium (Ti), aluminum (Al), another conductive material, a conductive material composition, or a combination thereof.

As further shown in FIG. 2, a barrier layer 228 is included between the source/drain interconnect structure 226 and one or more dielectric layers, including the ESL 208 and the dielectric layer 210. A first portion 228a of the barrier layer 228 is included between a portion of the source/drain interconnect structure 226 and the dielectric layer 210. A second portion 228b (which is located below the dielectric layer 210 and below the first portion 228a) of the barrier layer 228 is included between the source/drain interconnect structure 226 and the ESL 208. The barrier layer 228 is configured to promote adhesion between the source/drain interconnect structure 226 and the layers 208 and 210. The barrier layer 228 includes a titanium silicide (TiSi$_x$), a titanium silicon oxide (TiSixOy), a titanium silicon oxynitride (TiSi$_x$N$_y$O$_z$), and/or another material.

A bottom metal layer 230 may be included above and/or on the metal source/drain contact 222. The source/drain interconnect structure 226 may be included on the bottom metal layer 230. The bottom metal layer 230 may include titanium (Ti), ruthenium (Ru), tungsten (W), and/or another metal layer. In some implementations, the bottom metal layer 230 is omitted from the semiconductor device 200, and the source/drain interconnect structure 226 is included on the metal source/drain contact 222.

As indicated above, FIG. 2 is provided as an example. Other examples may differ from what is described with regard to FIG. 2.

Figure 3:
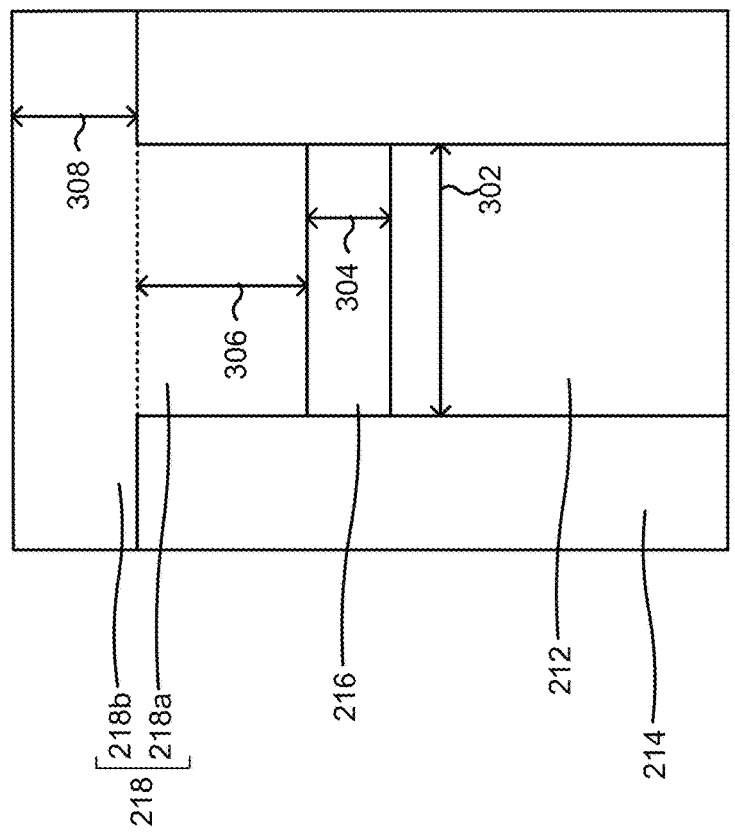

FIG. 3 is a diagram of an example implementation 300 of semiconductor structures described herein. The example implementation 300 includes various dimensions and/or parameters of a metal gate structure 212, of a plurality of sidewall spacers 214, of a metal capping layer 216, and of a dielectric capping layer 218 included in the semiconductor device 200.

As shown in FIG. 3, an example dimension 302 includes a width of the metal gate structure 212. In some implementations, the width of the metal gate structure 212 is included in a range of approximately 2 nanometers to approximately 50 nanometers to provide sufficient transistor channel control while enabling transistors to be densely integrated into the semiconductor device 200. However, other values for the width of the metal gate structure 212 are within the scope of the present disclosure. In some implementations, an aspect ratio between the width of the metal gate structure 212 and a height of the metal gate structure 212 is included in a range of approximately 1:1 to approximately 1:3 to provide sufficient transistor channel control while enabling transistors to be densely integrated into the semiconductor device 200. However, other values for the ratio are within the scope of the present disclosure.

As further shown in FIG. 3, an example dimension 304 includes a thickness of the metal capping layer 216. In some implementations, the thickness of the metal capping layer 216 is included in a range of approximately 1 nanometer to approximately 10 nanometers to achieve continuity and uniformity for the metal capping layer 216, to provide sufficient protection of the metal gate structure 212, and/or to achieve a sufficiently low contact resistance between the metal gate structure 212 and the gate interconnect structure 224. However, other values of the thickness of the metal capping layer 216 are within the scope of the present disclosure.

As further shown in FIG. 3, an example dimension 306 includes a thickness of the first portion 218a of the dielectric capping layer 218. In some implementations, the thickness of the first portion 218a is included in a range of approximately 1 nanometer to approximately 50 nanometers such that the height of the first portion 218a is approximately equal to the height of the top surfaces of the sidewall spacers 214. However, other values for the thickness of the first portion 218a are within the scope of the present disclosure.

As further shown in FIG. 3, an example dimension 308 includes a thickness of the second portion 218b of the dielectric capping layer 218. In some implementations, the thickness of the second portion 218b is included in a range of approximately 1 nanometer to approximately 30 nanometers such that the overall thickness of the dielectric capping layer 218 provides sufficient protection for the metal gate structure 212 and/or the metal capping layer 216. However, other values for the thickness of the second portion 218b are within the scope of the present disclosure.

As indicated above, FIG. 3 is provided as an example. Other examples may differ from what is described with regard to FIG. 3.

FIG. 4 is a diagram of an example implementation 400 of a semiconductor structure described herein. The example implementation 400 includes various dimensions and/or parameters of a metal source/drain contact 222 included in the semiconductor device 200.

As shown in FIG. 4, an example dimension 402 includes a thickness or height of the metal source/drain contact 222. In some implementations, the thickness or height of the metal source/drain contact 222 is included in a range of approximately 10 nanometers to approximately 80 nanometers to connect the metal source/drain contact 222 to an associated source/drain region 220 and such that a height of a top surface of the metal source/drain contact 222 and a height of a top surface of an associated dielectric capping layer 218 included in the semiconductor device 200 are approximately equal. However, other values for the thickness or height of the metal source/drain contact 222 are within the scope of the present disclosure.

As further shown in FIG. 4, an example dimension 404 includes a bottom width of the metal source/drain contact 222. In some implementations, the bottom width of the metal source/drain contact 222 is included in a range of approximately 10 nanometers to approximately 25 nanometers to provide sufficient contact area between the metal source/drain contact 222 and an associated source/drain region 220 of the semiconductor device 200 for contact resistance performance while enabling increased transistor integration in the semiconductor device 200. However, other values for the bottom width of the metal source/drain contact 222 are within the scope of the present disclosure.

As further shown in FIG. 4, an example dimension 406 includes a top width of the metal source/drain contact 222. In some implementations, the top width of the metal source/drain contact 222 is included in a range of approximately 11 nanometers to approximately 27 nanometers to provide sufficient contact area between the metal source/drain contact 222 and an associated source/drain interconnect structure 226 for contact resistance performance while enabling increased transistor integration in the semiconductor device 200. However, other values for the top width of the metal source/drain contact 222 are within the scope of the present disclosure.

In some implementations, an aspect ratio between a width of the metal source/drain contact 222 (e.g., the bottom width or the top width) and the thickness or height of the metal source/drain contact 222 is included in a range of approximately 1:1 to approximately 1:3 to enable increased transistor integration in the semiconductor device 200 while achieving sufficient gap-filling performance for the metal source/drain contact 222. However, other values for the ratio are within the scope of the present disclosure.

As further shown in FIG. 4, an example dimension 408 includes a depth of a recess 410 included in the metal source/drain contact 222 (e.g., included in a top portion of the metal source/drain contact 222). The recess 410 may be included in the top portion of the metal source/drain contact 222 to provide increased surface area for connection between the metal source/drain contact 222 and an associated source/drain interconnect structure 226. In some implementations, the depth of the recess 410 is included in a range of approximately 0.5 nanometers to approximately 3 nanometers to provide sufficient surface contact area for the associated source/drain interconnect structure 226 while minimizing damage to the metal source/drain contact 222. However, other values for the depth are within the scope of the present disclosure.

As indicated above, FIG. 4 is provided as an example. Other examples may differ from what is described with regard to FIG. 4.

FIG. 5 is a diagram of an example implementation 500 of a semiconductor structure described herein. The example implementation 500 includes various dimensions and/or parameters of a source/drain interconnect structure 226 included in the semiconductor device 200.

As shown in FIG. 5, an example dimension 502 includes a thickness or height of the source/drain interconnect structure 226. In some implementations, the thickness or height of the source/drain interconnect structure 226 is included in a range of approximately 50 nanometers to approximately 80 nanometers based on the thickness of the ESL 208, the thickness of the dielectric layer 210, the height of an associated metal source/drain contact 222, an aspect ratio that is to achieved for the source/drain interconnect structure 226, and/or one or more other parameters. However, other values for the thickness or height of the source/drain interconnect structure 226 are within the scope of the present disclosure.

As further shown in FIG. 5, an example dimension 504 includes a bottom width of the source/drain interconnect structure 226. In some implementations, the bottom width of the source/drain interconnect structure 226 is included in a range of approximately 5 nanometers to approximately 15 nanometers to provide sufficient contact area between the source/drain interconnect structure 226 and an associated metal source/drain contact 222 of the semiconductor device 200 for contact resistance performance while enabling increased transistor integration in the semiconductor device 200. However, other values for the bottom width of the source/drain interconnect structure 226 are within the scope of the present disclosure.

As further shown in FIG. 5, an example dimension 506 includes a top width of the source/drain interconnect structure 226. In some implementations, the top width of the source/drain interconnect structure 226 is included in a range of approximately 10 nanometers to approximately 20 nanometers based on the thickness or height of the source/drain interconnect structure 226, based on an aspect ratio that is to be achieved for the source/drain interconnect structure 226, and/or based on one or more other parameters. However, other values for the top width of the source/drain interconnect structure 226 are within the scope of the present disclosure.

As further shown in FIG. 5, an example dimension 508 includes a middle width of the source/drain interconnect structure 226. In some implementations, the middle width of the source/drain interconnect structure 226 is included in a range of approximately 8 nanometers to approximately 11 nanometers based on the thickness or height of the source/drain interconnect structure 226, based on an aspect ratio that is to be achieved for the source/drain interconnect structure 226, and/or based on one or more other parameters.

However, other values for the middle width of the source/drain interconnect structure 226 are within the scope of the present disclosure.

As further shown in FIG. 5, the source/drain interconnect structure 226 is tapered between a top surface of the source/drain interconnect structure 226 and a bottom surface of the source/drain interconnect structure 226. In some implementations, the source/drain interconnect structure 226 is tapered between the top surface and the bottom surface in an approximately continuous and uniform manner, as illustrated in the example in FIG. 5. However, in other implementations, the source/drain interconnect structure 226 is tapered between the top surface and the bottom surface in a non-linear and/or a non-uniform manner. The taper may include a curved taper, a tiered taper, or another type of non-linear and/or non-uniform taper. A non-linear and/or non-uniform taper may occur, for example, where the recess in which the source/drain interconnect structure 226 is to be formed is etched through a plurality of different layers having different etch selectivity and/or different etch rates.

In some implementations, an aspect ratio between a width of the source/drain interconnect structure 226 (e.g., the bottom width of the source/drain interconnect structure 226, (which corresponds to the example dimension 504), the top width of the source/drain interconnect structure 226 (which corresponds to the top width of the source/drain interconnect structure 226 and the example dimension 506), the middle width of the source/drain interconnect structure 226 (which corresponds to the example dimension 508)) and the overall thickness or height of the source/drain interconnect structure 226 (e.g., which corresponds to the example dimension 502) is included in a range of greater than approximately 1:7 to approximately 1:10 to enable increased transistor integration in the semiconductor device 200 while achieving sufficient gap-filling performance for the source/drain interconnect structure 226. However, other values for the aspect ratio are within the scope of the present disclosure.

As indicated above, FIG. 5 is provided as an example. Other examples may differ from what is described with regard to FIG. 5.

Figure 6A:
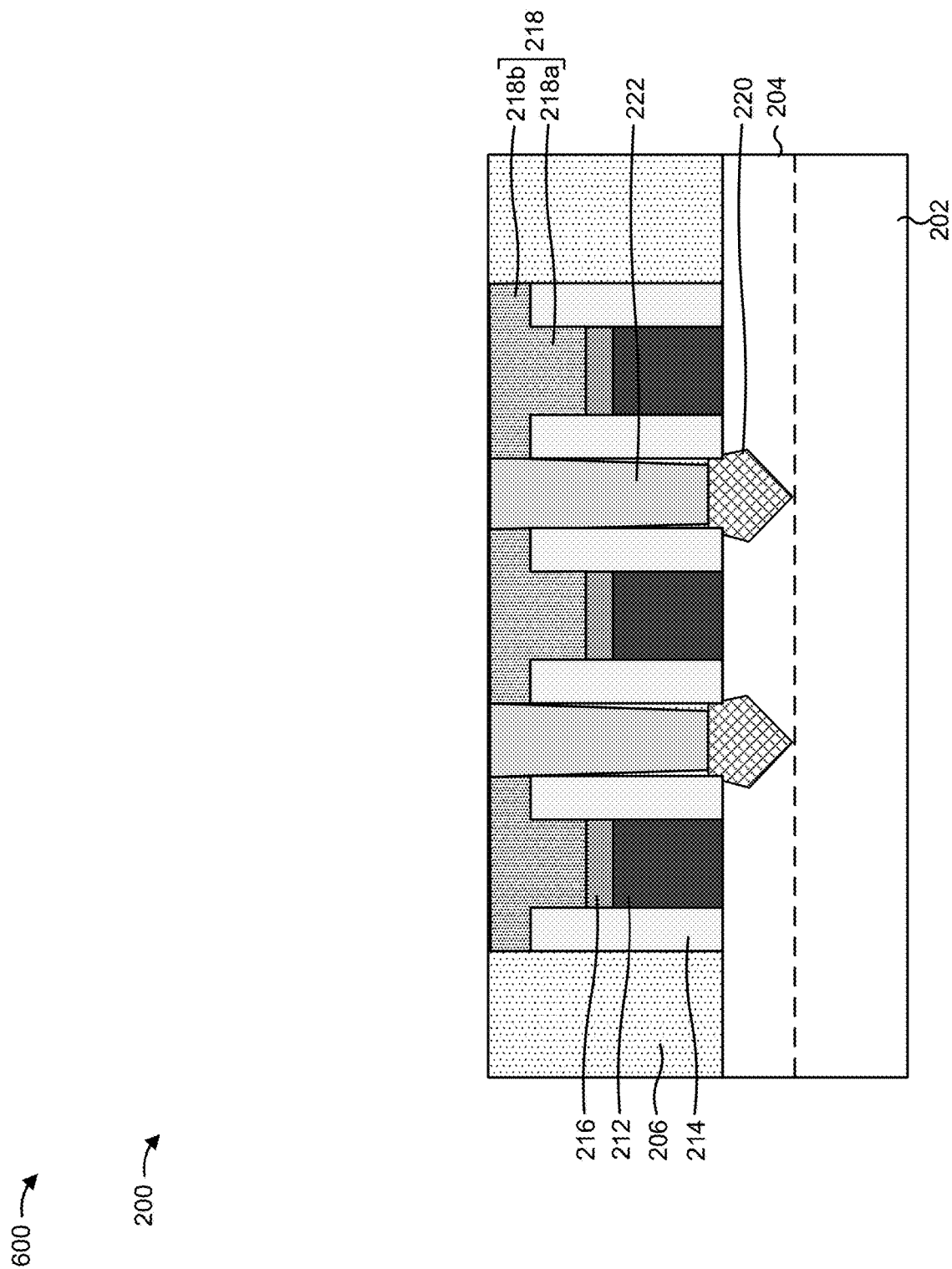

FIGS. 6A-6J are diagrams of an example implementation 600 described herein. The example implementation 600 includes an example of forming the gate interconnect structure 224 and the source/drain interconnect structure 226 illustrated in FIG. 2 and/or elsewhere herein. Moreover, the example implementation 600 includes an example of forming the barrier layer 228 illustrated in FIG. 8 and/or elsewhere herein. Turning to FIG. 6A, one or more operations may be performed to form the fin structure 204, the metal gate structures 212, the metal capping layers 216, the dielectric capping layers 218, the dielectric layer 206, the source/drain regions 220, and/or the metal source/drain contacts 222.

Figure 6B:
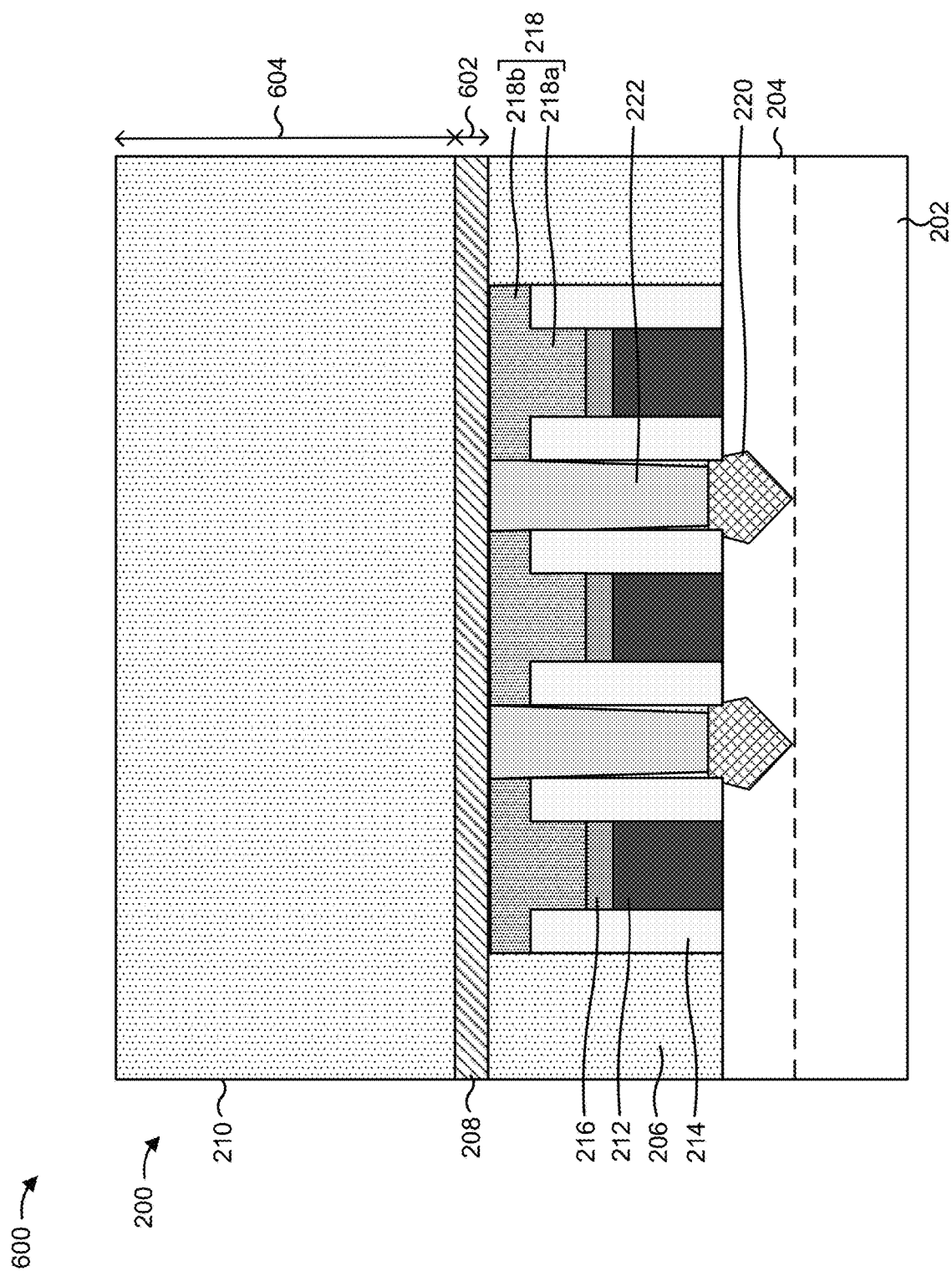

As shown in FIG. 6B, the ESL 208 is formed on the semiconductor device 200, and the dielectric layer 210 is formed over and/or on the ESL 208. In some implementations, a deposition tool 102 deposits the ESL 208 and the dielectric layer 210 using a CVD, ALD, PVD, and/or another deposition technique. An example dimension 602 for the ESL 208 includes a thickness. In some implementations, the ESL 208 is formed to a thickness that is included in a range of approximately 10 nanometers to approximately 20 nanometers to provide sufficient etch stop performance, to achieve a particular thickness or height for the gate interconnect structure 224 and/or a particular thickness or height for the source/drain interconnect structure 226, and/or based on one or more other parameters. However, other values for the thickness of the ESL 208 are within the scope of the present disclosure. An example dimension 604 for the dielectric layer 210 includes a thickness. In some implementations, the dielectric layer 210 is formed to a thickness that is included in a range of approximately 40 nanometers to approximately 60 nanometers to provide interlayer isolation, to achieve a particular thickness or height for the gate interconnect structure 224 and/or a particular thickness or height for the source/drain interconnect structure 226, and/or based on one or more other parameters. However, other values for the thickness of the dielectric layer 210 are within the scope of the present disclosure.

Figure 6C:
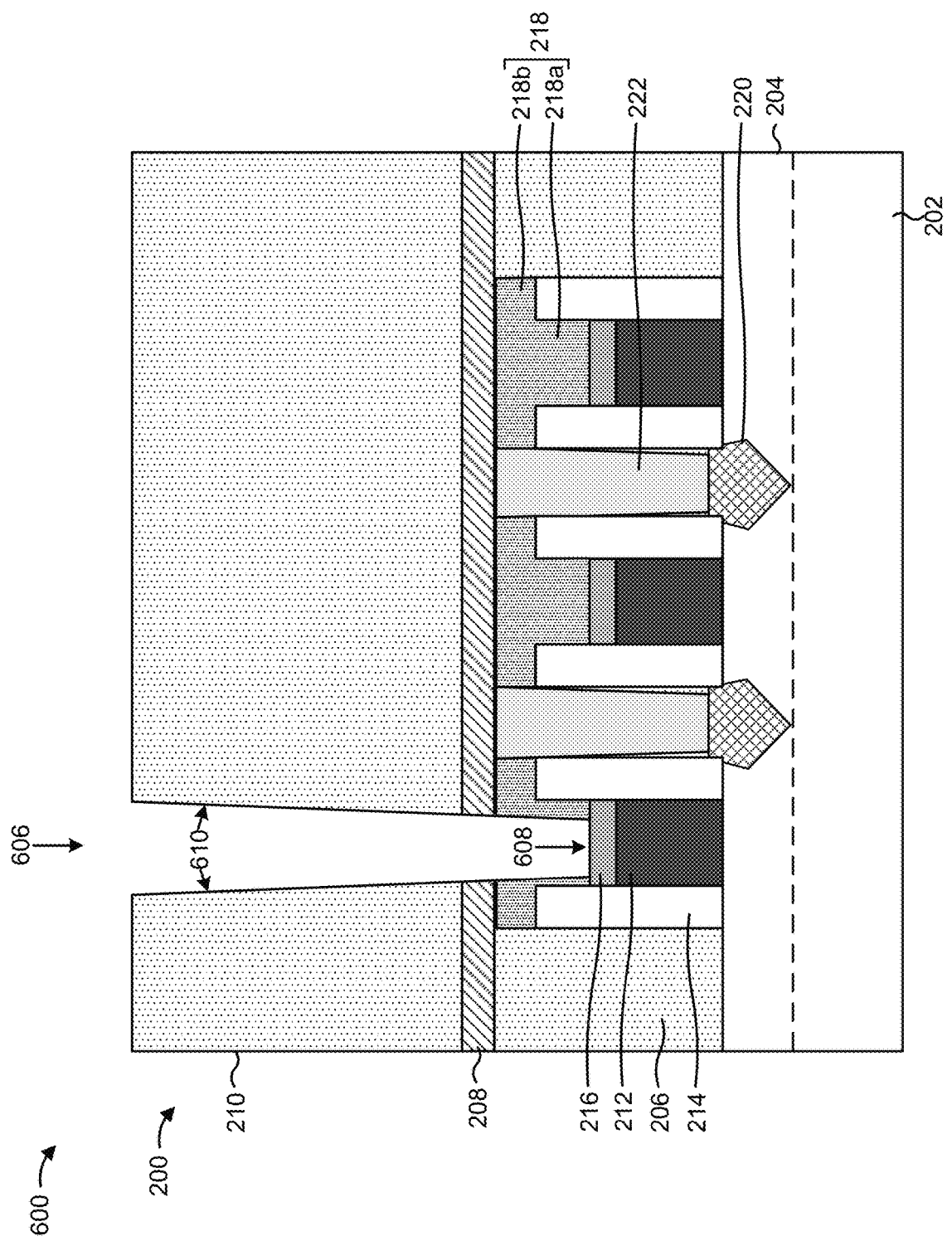

As shown in FIG. 6C, an opening (or a recess) 606 is formed in the dielectric layer 210 and in the ESL 208. In particular, the opening 606 is formed in and through the dielectric layer 210, in and through the ESL 208, in and through a dielectric capping layer 218, and to a conductive layer such as a metal capping layer 216 over and/or on a metal gate structure 212. In some implementations, the opening 606 is formed directly to the metal gate structure 212. As shown in FIG. 6C, the opening 606 includes a bottom surface 608 (which corresponds to the metal capping layer 216 or the metal gate structure 212) and sidewalls 610 (which correspond to the ESL 208, the dielectric layer 210, and the dielectric capping layer 218).

In some implementations, a pattern in a photoresist layer is used to etch the dielectric layer 210, the ESL 208, and the dielectric capping layer 218 to form the opening 606. In these implementations, the deposition tool 102 forms the photoresist layer on the dielectric layer 210. The exposure tool 104 exposes the photoresist layer to a radiation source to pattern the photoresist layer. The developer tool 106 develops and removes portions of the photoresist layer to expose the pattern. The etch tool 108 etches the dielectric layer 210, the ESL 208, and/or the dielectric capping layer 218 based on the pattern to form the opening 606. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for etching the opening 606 based on a pattern.

Figure 6D:
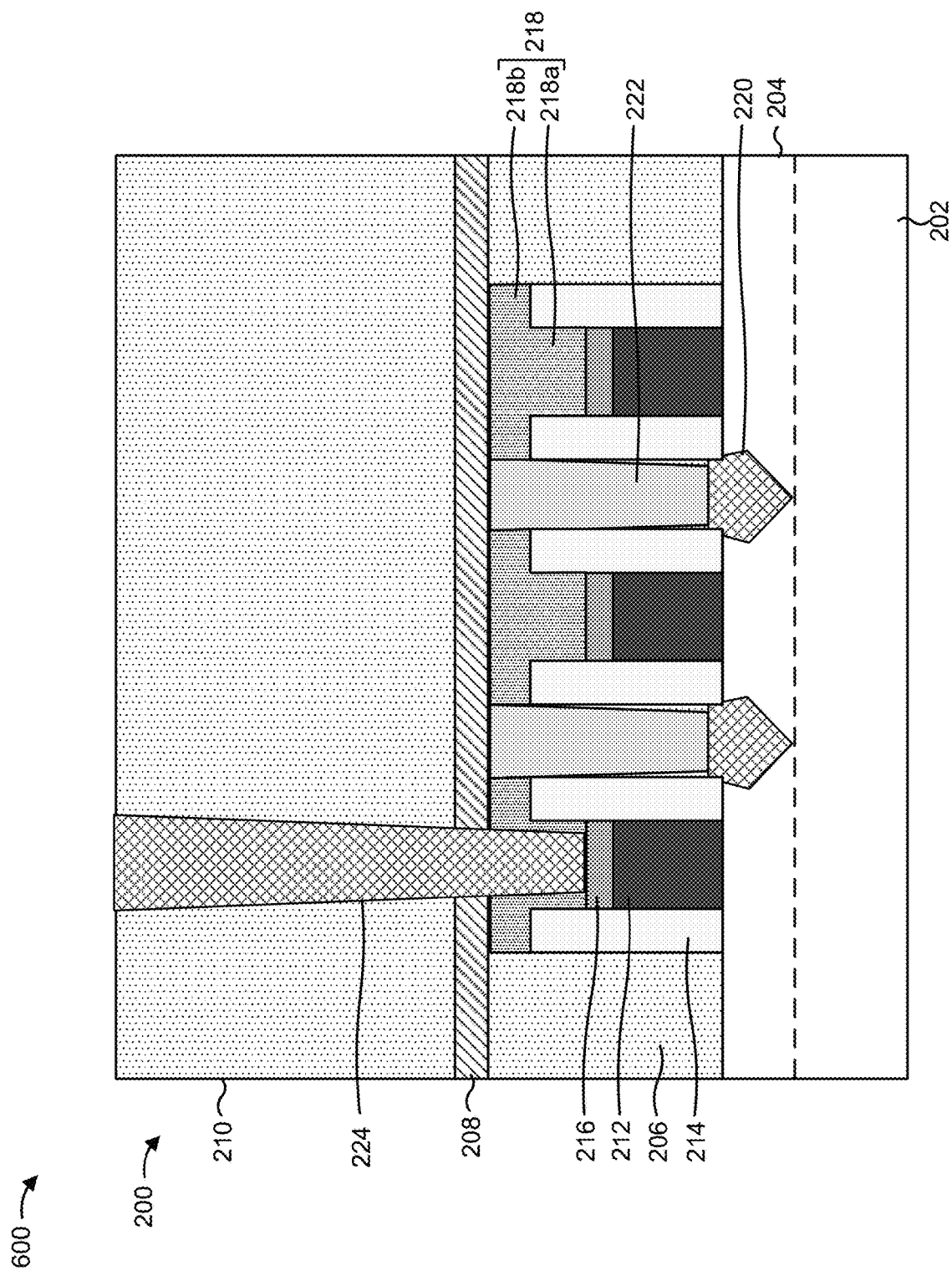

As shown in FIG. 6D, the opening 606 is filled with a conductive material (or a conductive material composition) to form the gate interconnect structure 224. In particular, the conductive material is deposited over the conductive structure (e.g., the metal capping layer 216 or the metal gate structure 212) in the opening 606. In some implementations, the deposition tool 102 performs a PVD operation, a CVD operation, or another type of deposition operation to form the gate interconnect structure 224 in the opening 606. In some implementations, the plating tool 112 performs a plating operation such as an electroplating operation to form the gate interconnect structure 224 in the first portion of the opening 606. In some implementations, the deposition tool 102 performs a deposition operation to deposit a seed layer in the opening 606 to promote adhesion of the sidewalls 610 and the deposition tool 102 performs another deposition operation (or the plating tool 112) performs a plating operation to fill in the remaining portion of the gate interconnect structure 224 over the seed layer.

Figure 6E:
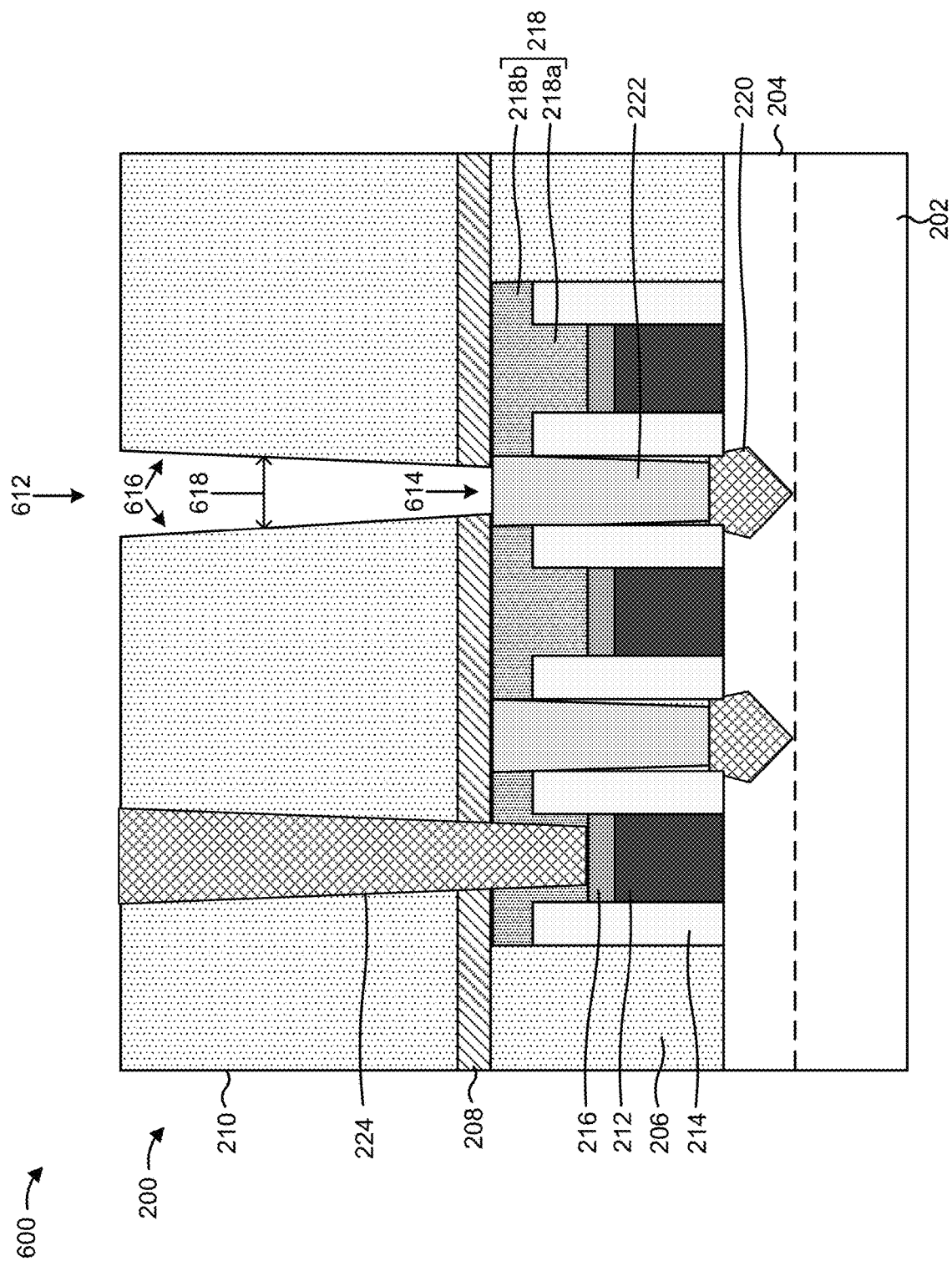

As shown in FIG. 6E, another opening (or another recess) 612 is formed in the dielectric layer 210 and in the ESL 208. In particular, the opening 612 is formed in and through the dielectric layer 210, in and through the ESL 208, and to a conductive layer (e.g., a metal layer, a metal contact) such as a metal source/drain contact 222. As shown in FIG. 6E, the opening 612 includes a bottom surface 614 (which corresponds to the top surface of the metal source/drain contact 222) and sidewalls 616 (which correspond to the ESL 208 and the dielectric layer 210). The opening 612 may be formed to one or more example dimensions 618, including a bottom width, a middle width, and/or a top width. In some implementations, the opening 612 is formed to a bottom width that is included in a range of approximately 6 nanometers to approximately 15 nanometers to provide sufficient contact area for the source/drain interconnect structure 226, that is to be formed in the opening 612, to connect to the metal source/drain contact 222 (e.g., to land on the top surface of the metal source/drain contact 222). However, other values for the bottom width are within the scope of the present disclosure.

In some implementations, a pattern in a photoresist layer is used to etch the dielectric layer 210 and the ESL 208 to form the opening 612. In these implementations, the deposition tool 102 forms the photoresist layer on the dielectric layer 210. The exposure tool 104 exposes the photoresist layer to a radiation source to pattern the photoresist layer. The developer tool 106 develops and removes portions of the photoresist layer to expose the pattern. The etch tool 108 etches the dielectric layer 210 and the ESL 208 based on the pattern to form the opening 612. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for etching the opening 612 based on a pattern.

Figure 6F:
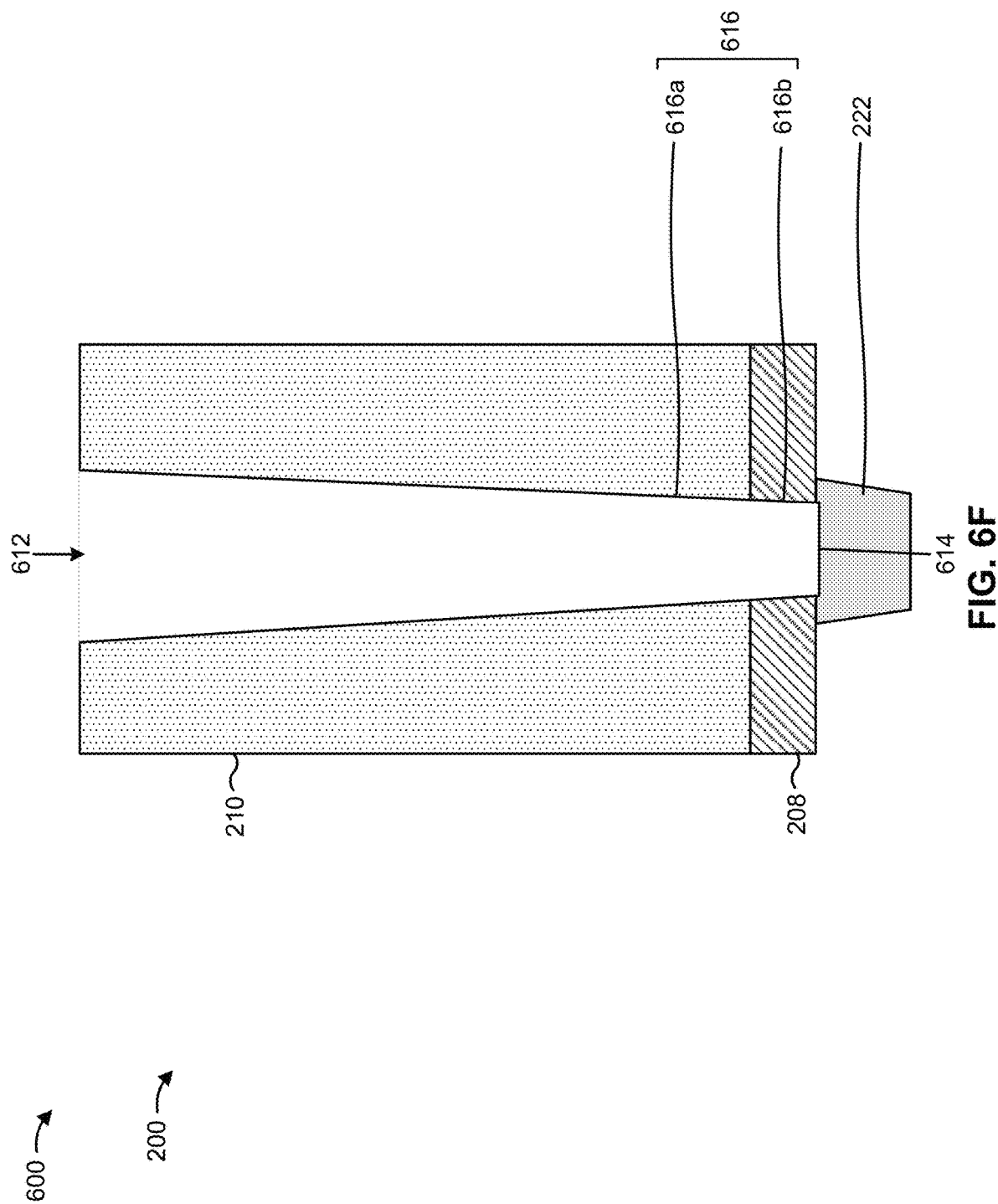

As shown in FIG. 6F, the sidewalls 616 of the opening 612 include a plurality of portions. Each of the plurality of portions extends along a portion of the height or depth of the opening 612 (e.g., along a portion of the height or depth between the bottom surface 614 and a top surface of the dielectric layer 210). The plurality of portions of the sidewalls 616 may correspond to the layers in which the opening 612 is formed. For example, a first portion 616a of the sidewalls 616 corresponds to the dielectric layer 210. As another example, a second portion 616b of the sidewalls 616 correspond to the ESL 208. In some implementations, the dielectric layer 210 and the ESL 208 are formed of different materials. As an example, the dielectric layer 210 may be formed of a silicon oxide ($SiO_x$ such as $SiO_2$), and the ESL 208 may be formed of a silicon nitride ($Si_xN_y$ such as $Si_3N_4$). In these implementations, the first portion 616a of the sidewalls 616 and the second portion 616b of the sidewalls 616 include different materials. In particular, the first portion 616a of the sidewalls 616 includes a silicon oxide ($SiO_x$ such as $SiO_2$), and the second portion 616b of the sidewalls 616 includes a silicon nitride ($Si_xN_y$ such as $Si_3N_4$). However, other silicon-containing materials for the plurality of portions of the sidewalls 616 are within the scope of the present disclosure.

Figure 6G:
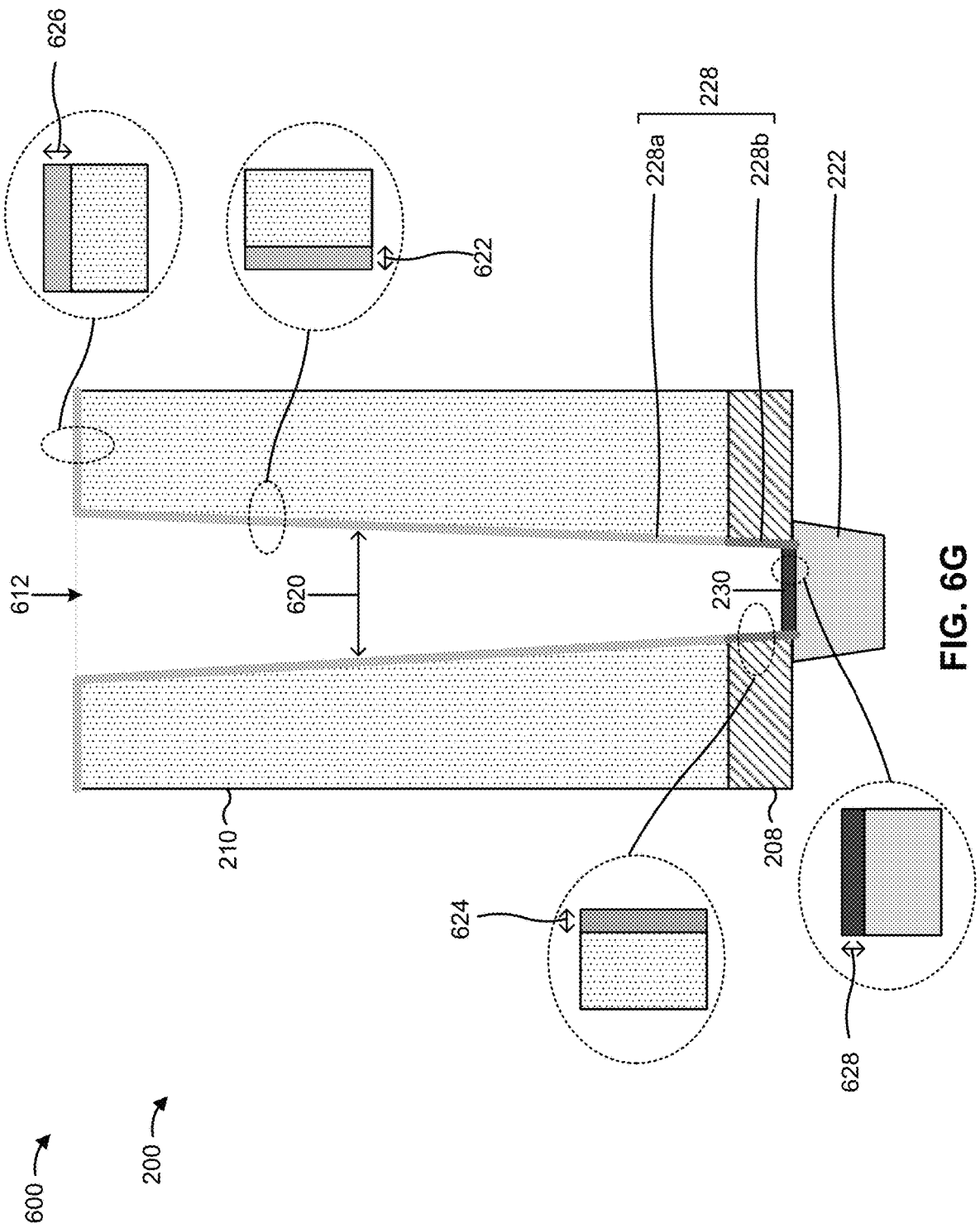

As shown in FIG. 6G, the barrier layer 228 is formed in the opening 612. In particular, the barrier layer 228 is formed in the sidewalls 616. The barrier layer 228 is formed in a portion of the thickness of the sidewalls 616 in opening 612 prior to formation of the source/drain interconnect structure 226 in the opening 612. The barrier layer 228 is formed in the portion of the thickness of the sidewalls 616 by a plasma-based deposition operation. The plasma-based deposition operation may include a PECVD operation performed by the deposition tool 102 (e.g., a PECVD tool).

In the plasma-based deposition operation, a precursor is provided onto the surfaces of the sidewalls 616 in the opening 612. A plasma (e.g., a directional plasma) is used to bombard the sidewalls 616 with ions to supply energy to stimulate or cause a diffusion of silicon (Si) atoms in the sidewalls 616 toward the surface of the sidewalls 616 in the opening 612 to create a silicon-rich surface on the sidewalls 616. The precursor reacts with the silicon-rich surface of the sidewalls 616 in the opening 612 to form the barrier layer 228 in the sidewalls 616. The barrier layer 228 is formed in the portion of the thickness of the sidewalls 616 in that the precursor consumes a portion of the silicon-rich surface of the sidewalls 616 as a result of the plasma treatment. In other words, the barrier layer 228 is formed in a portion of the sidewalls 616 as opposed to the barrier layer 228 being grown on top of the surface of the sidewalls 616 in the recess. As a result, the formation of the barrier layer 228 does not reduce or decrease the cross-sectional width of the opening 612, or reduces the cross-sectional width of the opening 612 by a small amount. As an example, an example dimension 620 (e.g., a bottom width, a middle width, a top width) of the opening 612 after formation of the barrier layer 228 may be approximately equal to the example dimension 618 of the opening 612 prior to formation of the barrier layer 228. As another example, a ratio of the width of the opening 612 after formation of the barrier layer 228, and a width of the opening 612 prior to formation of the barrier layer 228 (e.g., a ratio of the example dimension 620 to the example dimension 618), may be in a range of approximately 1:0.83 to approximately 1:0.973 to provide sufficient gap-filling performance for the source/drain interconnect structure 226.

An example plasma-based deposition operation includes providing a flow of a titanium precursor such as a titanium chloride ($TiCl_x$) or another type of titanium precursor, and a flow of a reactant gas (e.g., a hydrogen ($H_2$) gas or another type of reactant or processing gas), into a deposition chamber of the deposition tool 102 in which the semiconductor device 200 is positioned. The flow of the titanium chloride and the flow of the reactant gas are provided into the deposition chamber at respective flow rates. A ratio of the titanium chloride to the reactant gas provided to the chamber may be included in a range of greater than approximately 1:1 to approximately 1:1.25 to provide sufficient titanium chloride to the deposition chamber while maintaining a low likelihood of pure titanium (Ti) formation on the sidewalls 616 in the opening 612. However, other values for the ratio are within the scope of the present disclosure. The flow of the titanium chloride and the flow of the hydrogen gas may be provided into the deposition chamber for a time duration that is in a range of approximately 10 seconds to approximately 80 seconds to form the barrier layer 228 to a sufficient thickness. However, other values for the time duration are within the scope of the present disclosure.

The flow of the titanium chloride and the flow of the hydrogen gas may be provided into the deposition chamber while a temperature in the deposition chamber is in a range of approximately 350 degrees Celsius to approximately 500 degrees Celsius to provide sufficient barrier layer formation while maintaining a sufficiently low titanium deposition rate (e.g., such that the titanium chloride etching rate of titanium on the sidewalls 616 is greater than the titanium deposition rate on the sidewalls 616). However, other values for the temperature are within the scope of the present disclosure. The pressure in the deposition chamber may be in a range of greater than 0 Torr to less than approximately 5 Torr to provide sufficient pressure to facilitate a reaction between the titanium chloride and the sidewalls 616 while minimizing the likelihood of titanium chloride condensation in the deposition chamber. However, other values for the pressure are within the scope of the present disclosure.

A plasma (e.g., an argon (Ar) based plasma, a nitrogen ($N_2$) based plasma, another type of plasma) is provided into (or formed in) the deposition chamber. The plasma may be provided into (or formed in) the deposition chamber prior to, during, and/or after the flow of the titanium chloride and the flow of the hydrogen gas are provided into the chamber. The plasma may be generated by capacitive coupling, inductive coupling, or another plasma generation technique.

The plasma is used to treat the surfaces of the sidewalls 616. The surface treatment using the plasma results in mobility of silicon atoms in the sidewalls 616. For example, the plasma bombards the surfaces of the first portion 616a of the sidewalls 616 corresponding to the dielectric layer 210 (which may include a silicon oxide ($SiO_x$), for example), which results in silicon atoms becoming mobilized in the dielectric layer 210 diffusing toward the surface of the first portion 616a of the sidewalls 616 and results in the formation of a silicon-rich surface in the first portion 616a of the sidewalls 616. As another example, the plasma bombards the surfaces of the second portion 616b of the sidewalls 616 corresponding to the ESL 208 (which may include a silicon nitride ($Si_xN_y$), for example), which results in silicon atoms becoming mobilized in the ESL 208 diffusing toward the surface of the second portion 616b of the sidewalls 616 and results in the formation of a silicon-rich surface in the second portion 616b of the sidewalls 616.

The titanium chloride, the hydrogen gas, and the silicon-rich surface of the first portion 616a of the sidewalls 616 react to form the first portion 228a of the barrier layer 228 in the first portion 616a of the sidewalls 616. An example reaction includes:

$$TiCl_x + H_2 + SiO_x \rightarrow TiSi_xO_y + HCL$$

where the titanium chloride, the hydrogen gas, and the silicon in the silicon-rich surface react to form titanium silicon oxide ($TiSi_xO_y$) in the first portion 616a of the sidewalls 616. The chlorine in the titanium chloride and hydrogen in the hydrogen gas also react, which results in the formation of hydrochloric acid (HCL) as a byproduct in the plasma-based deposition operation, which is removed from the deposition chamber.

The titanium chloride, the hydrogen gas, and the silicon-rich surface of the second portion 616b of the sidewalls 616 react to form the second portion 228b of the barrier layer 228 in the second portion 616b of the sidewalls 616. An example reaction includes:

$$TiCl_x + H_2 + Si_xN_y \rightarrow TiSi_xN_y + HCL$$

where the titanium chloride, the hydrogen gas, and the silicon in the silicon-rich surface react to form titanium silicon nitride ($TiSi_xN_y$) in the second portion 616b of the sidewalls 616. The chlorine in the titanium chloride and hydrogen in the hydrogen gas also react, which results in the formation of hydrochloric acid (HCL) as a byproduct in the plasma-based deposition operation, which is removed from the deposition chamber. The second portion 228b is below the first portion 228a in the opening 612. The second portion 228b is adjacent to the bottom surface 614 in the opening 612.

As further shown in FIG. 6G, the bottom metal layer 230 is formed in the plasma-based deposition operation. The bottom metal layer 230 is formed on the top surface of the metal source/drain contact 222. The titanium chloride and the hydrogen gas may react to form the bottom metal layer 230 on the top surface of the metal source/drain contact 222. An example reaction includes:

$$TiCl_x + H_2 \rightarrow Ti + HCL$$

where the titanium chloride and the hydrogen gas react to form titanium (Ti) on the top surface of the metal source/drain contact 222. The chlorine in the titanium chloride and the hydrogen in the hydrogen gas also react, which results in the formation of hydrochloric acid (HCL) as a byproduct in the plasma-based deposition operation, which is removed from the deposition chamber.

As further shown in FIG. 6G, the barrier layer and the bottom metal layer 230 may include one or more example dimensions. An example dimension 622 of the first portion 228a of the barrier layer 228 includes a thickness of the first portion 228a of the barrier layer 228 in the first portion 616a of the sidewalls 616 (e.g., in the dielectric layer 210 portion of the sidewalls 616). In some implementations, the thickness of the first portion 228a of the barrier layer 228 in the first portion 616a of the sidewalls 616 is included in a range of approximately 0.2 nanometers to approximately 0.5 nanometers to provide sufficient thickness to promote adhesion between the barrier layer 228 and the source/drain interconnect structure 226 that is to be formed in the opening 612 (e.g., to provide a sufficient quantity of atomic layers in the barrier layer 228 to facilitate nucleation of the conductive material the source/drain interconnect structure 226 with the barrier layer 228). However, other values for the thickness of the first portion 228a of the barrier layer 228 in the first portion 616a of the sidewalls 616 are within the scope of the present disclosure.

An example dimension 624 of the second portion 228b of the barrier layer 228 includes a thickness of the second portion 228b of the barrier layer 228 in the second portion 616b of the sidewalls 616 (e.g., in the ESL 208 portion of the sidewalls 616). In some implementations, the thickness of the second portion 228b of the barrier layer 228 in the second portion 616b of the sidewalls 616 is included in a range of approximately 0.2 nanometers to approximately 0.5 nanometers to provide sufficient thickness to promote adhesion between the barrier layer 228 and the source/drain interconnect structure 226 that is to be formed in the opening 612 (e.g., to provide a sufficient quantity of atomic layers in the barrier layer 228 to facilitate nucleation of the conductive material the source/drain interconnect structure 226 with the barrier layer 228). However, other values for the thickness of the second portion 228b of the barrier layer 228 in the second portion 616b of the sidewalls 616 are within the scope of the present disclosure.

An example dimension 626 of the barrier layer 228 in the top surface of the dielectric layer 210 includes a thickness of the barrier layer 228 in the top surface of the dielectric layer 210. In some implementations, the thickness of the barrier layer 228 in the top surface of the dielectric layer 210 is greater relative to the thickness of the first portion 228a of the barrier layer 228 in the first portion 616a of the sidewalls 616 and/or greater relative to the thickness of the second portion 228b of the barrier layer 228 in the second portion 616b of the sidewalls 616 due to the directional property of the plasma that is used to form the barrier layer 228. For example, the thickness of the barrier layer 228 in the top surface of the dielectric layer 210 may be included in a range of approximately 1 nanometer to approximately 2 nanometers. In some implementations, a ratio to the thickness of the barrier layer 228 in the top surface of the dielectric layer 210 to the thickness of the first portion 228a of the barrier layer 228 in the first portion 616a of the sidewalls 616 and/or to the thickness of the second portion 228b is included in a range of approximately 2:1 to approximately 10:1.

An example dimension 628 of the bottom metal layer 230 includes a thickness of the bottom metal layer 230. In some implementations, the thickness of the bottom metal layer 230 is included in a range of approximately 1 nanometer to approximately 3 nanometers to provide sufficiently low contact resistance between the metal source/drain contact 222 and the source/drain interconnect structure 226 that is to be formed in the opening 612.

Figure 6I:
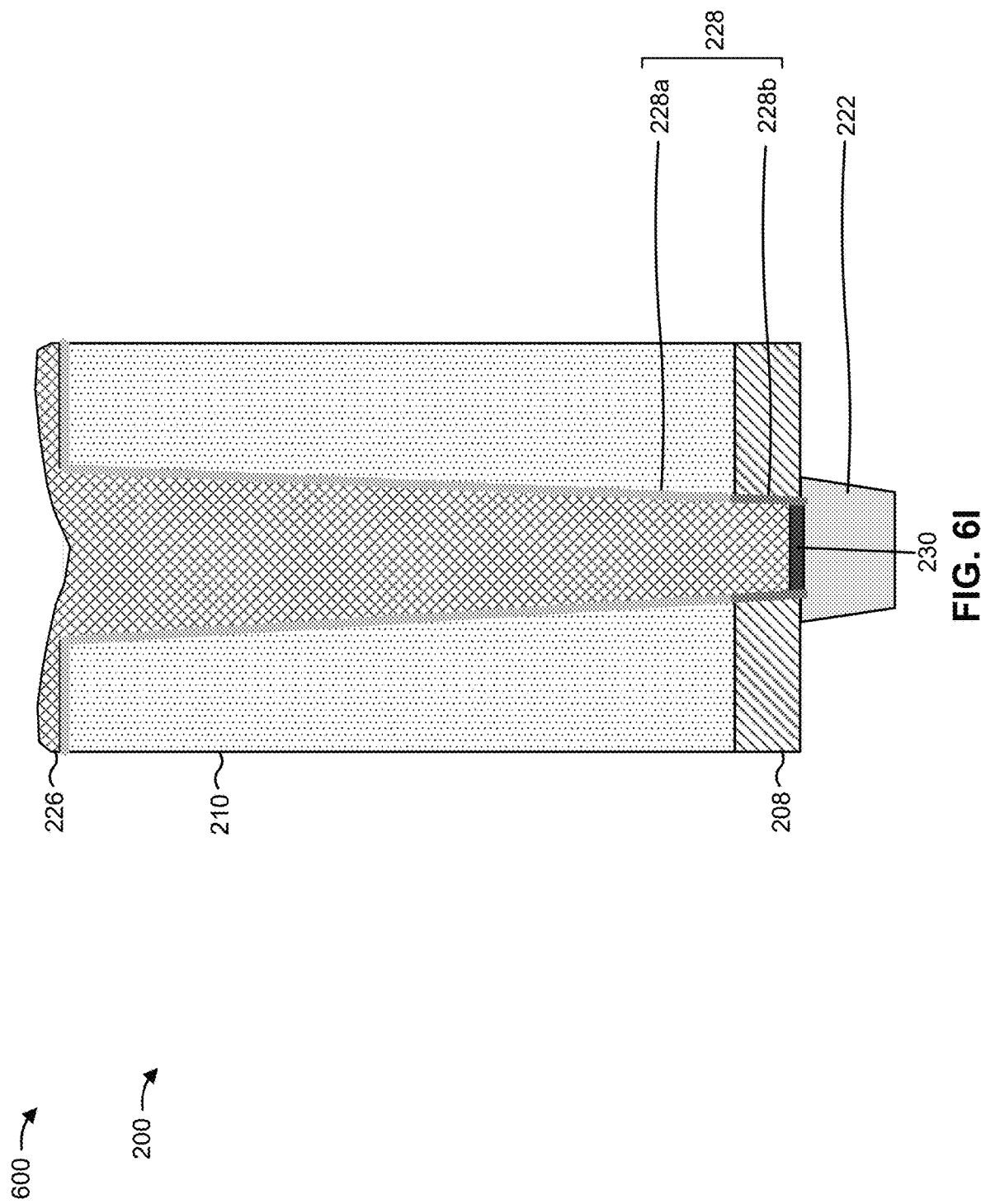

As shown in FIGS. 6H and 6I, the opening 612 is filled with a conductive material (or a conductive material composition) to form the source/drain interconnect structure 226. In particular, the conductive material is deposited on bottom metal layer 230 over the metal source/drain contact 222 in the opening 612, and on the barrier layer 228 in the opening 612. The conductive material may include ruthenium (Ru) (e.g., such that the source/drain interconnect structure 226 includes a ruthenium interconnect structure) or another type of conductive material. In some implementations, the deposition tool 102 performs a PVD operation, a CVD operation, or another type of deposition operation to form the source/drain interconnect structure 226 in the opening 612. In some implementations, the plating tool 112 performs a plating operation such as an electroplating operation to form the source/drain interconnect structure 226 in the opening 612. In some implementations, the deposition tool 102 performs a deposition operation to deposit a seed layer in the opening 612 to further promote adhesion of the conductive material to the barrier layer 228, and the deposition tool 102 performs another deposition operation (or the plating tool 112 performs a plating operation) to fill in the remaining portion of the source/drain interconnect structure 226 over the seed layer.

As further shown in FIGS. 6H and 6I, the deposition operation to form the source/drain interconnect structure 226 may include a conformal (or super-conformal) deposition operation. In these implementations, the conductive material grows on the bottom metal layer 230 over the bottom surface 614, and on the barrier layer 228 in the sidewalls 616 in a manner in which the conductive material conforms to the shape and/or profile of the opening 612 as the opening 612 is filled with the conductive material.

As further shown in FIG. 6I, the opening 612 may be overfilled to ensure complete filling of the opening 612 with the source/drain interconnect structure 226. Accordingly, and as shown in FIG. 6J, a CMP operation is performed to planarize the gate interconnect structure 224. In these implementations, the planarization tool 110 may perform a CMP operation to planarize the top surface of the dielectric layer 210 and the top surface of the source/drain interconnect structure 226. The CMP operation is performed to remove excess conductive material of the source/drain interconnect structure 226 from the top surface of the dielectric layer 210. Moreover, the CMP operation is performed to remove material of the barrier layer 228 that is formed in the top surface of the dielectric layer 210.

The techniques described in connection with FIGS. 6A-6J enable the barrier layer 228 to be used to promote adhesion in the opening 612 while minimizing the reduction in the cross-sectional width for the source/drain interconnect structure 226 that is to be subsequently formed in the opening 612. This reduces roughness of the source/drain interconnect structure 226, reduces contact resistance for the source/drain interconnect structure 226, increases device performance, increases yield, reduces defects, and/or reduces device failures for the semiconductor device 200, among other examples.

As indicated above, FIGS. 6A-6J are provided as examples. Other examples may differ from what is described with regard to FIG. 6A-6J.

FIGS. 7A-7E are diagrams of an example implementation 700 described herein. The example implementation 700 includes an alternative example of forming the source/drain interconnect structure 226, in which the bottom metal layer 230 is removed from the bottom surface 614 in the opening 612 after formation of the barrier layer 228 and prior to formation of the source/drain interconnect structure 226.

Turning to FIG. 7A, one or more operations may be performed to form the opening 612, to form the barrier layer 228, and to form the bottom metal layer 230. In some implementations, one or more operations and/or techniques described in connection with FIGS. 6A-6G are performed to form the opening 612, to form the barrier layer 228, and to form the bottom metal layer 230.

As further shown in FIG. 7A, the process of forming the opening 612 may result in some etching of the dielectric layer 210, which may result in the top surface of the dielectric layer 210 being sloped downward toward the opening 612. In some implementations, a similar sloping may occur in the example 600 of FIGS. 6A-6G. The first portion 228a of the barrier layer 228 may conform to the sloped top surface of the dielectric layer 210.

As shown in FIG. 7B, the bottom metal layer 230 is removed from the top surface of the metal source/drain contact 222 after formation of the barrier layer 228. The bottom metal layer 230 may be removed from the top surface of the metal source/drain contact 222 to reduce the quantity of interfaces between different types of metal layers from the metal source/drain contact 222 to the source/drain interconnect structure 226 that is to be formed in the opening 612. The contact resistance between the metal source/drain contact 222 and the source/drain interconnect structure 226 may increase as the quantity of metal-to-metal interfaces increases. Removal of the bottom metal layer 230 from the top surface of the metal source/drain contact 222 reduces the quantity of interfaces, which may reduce the contact resistance between the metal source/drain contact 222 and the source/drain interconnect structure 226. The bottom metal layer 230 may be removed in an etching operation, in which the etch tool 108 performs a plasma-based etching operation to remove the bottom metal layer 230 using a plasma (e.g., an argon (Ar) plasma, a nitrogen ($N_2$) plasma, or another type of plasma).

Figure 7D:
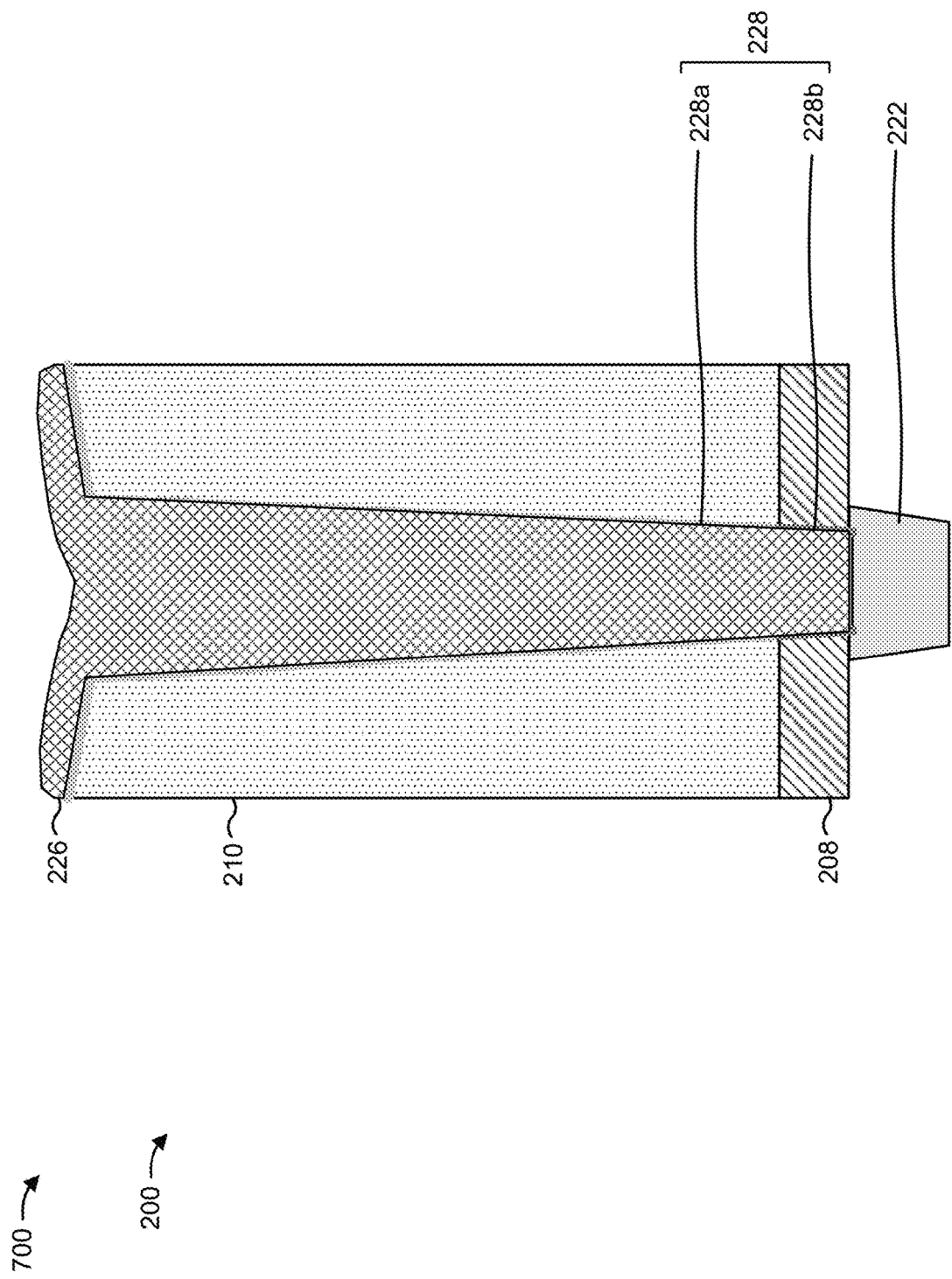

As shown in FIGS. 7C and 7D, the opening 612 is filled with a conductive material (or a conductive material composition) to form the source/drain interconnect structure 226. In particular, the conductive material is deposited on the metal source/drain contact 222 in the opening 612, and on the barrier layer 228 in the opening 612. The conductive material may include ruthenium (Ru) (e.g., such that the source/drain interconnect structure 226 includes a ruthenium interconnect structure) or another type of conductive material. In some implementations, the deposition tool 102 performs a PVD operation, a CVD operation, or another type of deposition operation to form the source/drain interconnect structure 226 in the opening 612. In some implementations, the plating tool 112 performs a plating operation such as an electroplating operation to form the source/drain interconnect structure 226 in the opening 612. In some implementations, the deposition tool 102 performs a deposition operation to deposit a seed layer in the opening 612 to further promote adhesion of the conductive material to barrier layer 228, and the deposition tool 102 performs another deposition operation (or the plating tool 112 performs a plating operation) to fill in the remaining portion of the source/drain interconnect structure 226 over the seed layer.

As further shown in FIGS. 7C and 7D, the deposition operation to form the source/drain interconnect structure 226 may include a conformal (or super-conformal) deposition operation. In these implementations, the conductive material grows on the metal source/drain contact 222, and on the barrier layer 228 in the sidewalls 616 in a manner in which the conductive material conforms to the shape and/or profile of the opening 612 as the opening 612 is filled with the conductive material.

Figure 7E:
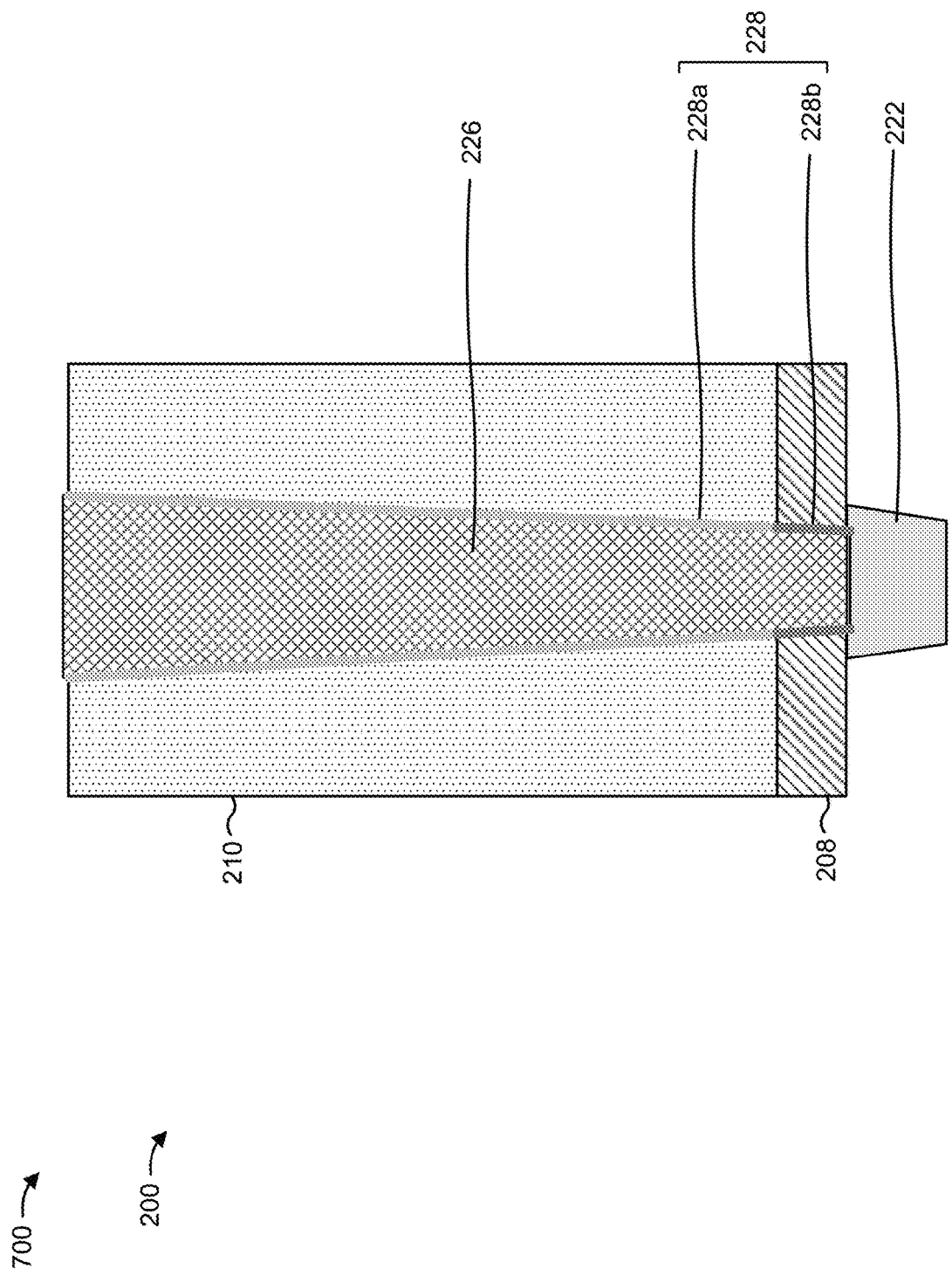

As further shown in FIG. 7D, the opening 612 may be overfilled to ensure complete filling of the opening 612 with the source/drain interconnect structure 226. Accordingly, and as shown in FIG. 7E, a CMP operation is performed to planarize the gate interconnect structure 224. In these implementations, the planarization tool 110 may perform a CMP operation to planarize the top surface of the dielectric layer 210 and the top surface of the source/drain interconnect structure 226. The CMP operation is performed to remove excess conductive material of the source/drain interconnect structure 226 from the top surface of the dielectric layer 210. Moreover, the CMP operation is performed to remove material of the barrier layer 228 that is formed in the top surface of the dielectric layer 210. The CMP operation may also result in the sloped top surface of the dielectric layer 210 being removed such that the top surface of the dielectric layer is approximately flat.

As indicated above, FIGS. 7A-7E are provided as examples. Other examples may differ from what is described with regard to FIG. 7A-7E.

Figure 8:
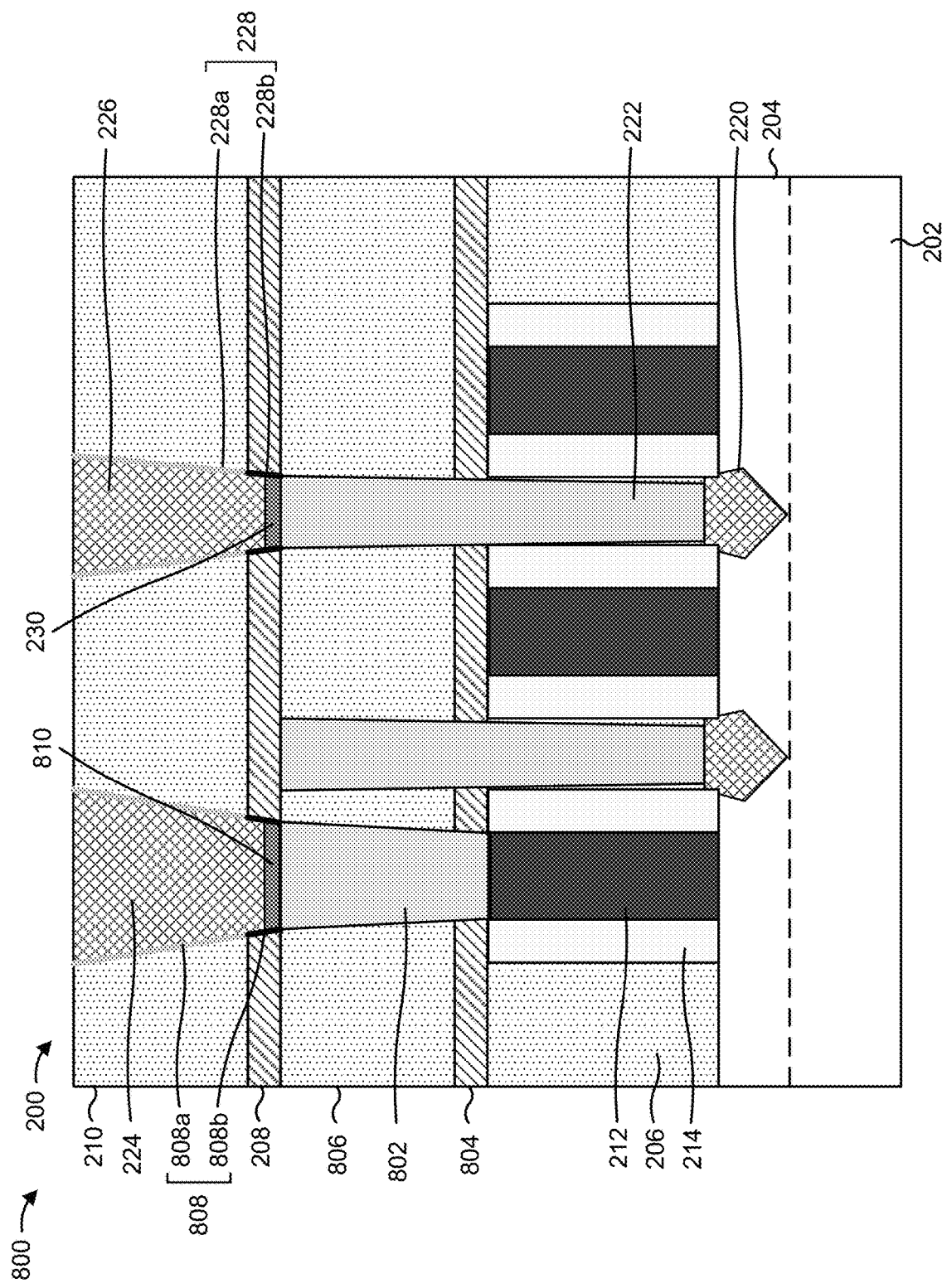
FIG. 8 is a diagram of another example implementation of a portion of the semiconductor device of FIG. 2.

FIG. 8 is a diagram of another example implementation 800 of a portion of the semiconductor device 200 of FIG. 2. As shown in FIG. 8, the portion of the semiconductor device 200 includes similar structures as illustrated in FIG. 2. However, in the example implementation 800, the semiconductor device 200 further includes a metal gate contact 802. The metal capping layer 216 and/or the dielectric capping layer 218 may be omitted from the semiconductor device 200 in the example implementation 800, and the sidewall spacers 214 may approximately extend from fin structure 204 to another ESL 804. Similarly, the metal gate structure 212 may approximately extend from fin structure 204 to another ESL 804. Another dielectric layer 806 (e.g., an ILD1 layer) may be included between the dielectric layer 206 (e.g., the ILD0 layer) and the dielectric layer 210 (e.g., the ILD2 layer). The metal source/drain contacts 222 may extend from the source/drain regions 220 to approximately the top surface of the dielectric layer 806, similar to the metal gate contact 802 (which may be referred to as an MP). In this way, the height of the top surface of the metal gate contact 802 and the height of the top surface of the metal source/drain contacts 222 are approximately the same height. Accordingly, the vertical position of the top surface of the metal gate contact 802 in the semiconductor device 200 and the vertical position of the top surface of the metal source/drain contacts 222 are approximately equal.

As further shown in FIG. 8, the gate interconnect structure 224 is electrically and/or physically connected to the metal gate contact 802. The source/drain interconnect structure 226 is electrically and/or physically connected to a metal source/drain contact 222. The gate interconnect structure 224 and the source/drain interconnect structure 226 may be located in and/or through the ESL 208 and in and/or through the dielectric layer 210. In this way, the height of the gate interconnect structure 224 and the height of the source/drain interconnect structure 226 are approximately the same height.

As further shown in FIG. 8, the barrier layer 228 is included between the source/drain interconnect structure 226 and one or more dielectric layers including the dielectric layer 210 and the ESL 208. Moreover, the bottom metal layer 230 may be included between the source/drain interconnect structure 226 and the metal source/drain contact 222. However, in other implementations, the bottom metal layer 230 is omitted from the semiconductor device 200, as described above with respect to FIGS. 7A-7E.

As further shown in FIG. 8, another barrier layer 808 is included between the gate interconnect structure 224 and one or more dielectric layers including the dielectric layer 210 and the ESL 208. Moreover, another bottom metal layer 810 may be included between the gate interconnect structure 224 and the metal gate contact 802. However, in other implementations, the bottom metal layer 810 is omitted from the semiconductor device 200. The barrier layer 808 may include a first portion 808*a* and a second portion 808*b*, similar to the first portion 228*a* and the second portion 228*b* of the barrier layer 228. The barrier layer 808 (including the first portion 808*a* and the second portion 808*b*) and the bottom metal layer 810 may be formed by similar operations and/or techniques described in connection with FIGS. 6A-6J and/or 7A-7E.

As indicated above, FIG. 8 is provided as an example. Other examples may differ from what is described with regard to FIG. 8.

Figure 9:
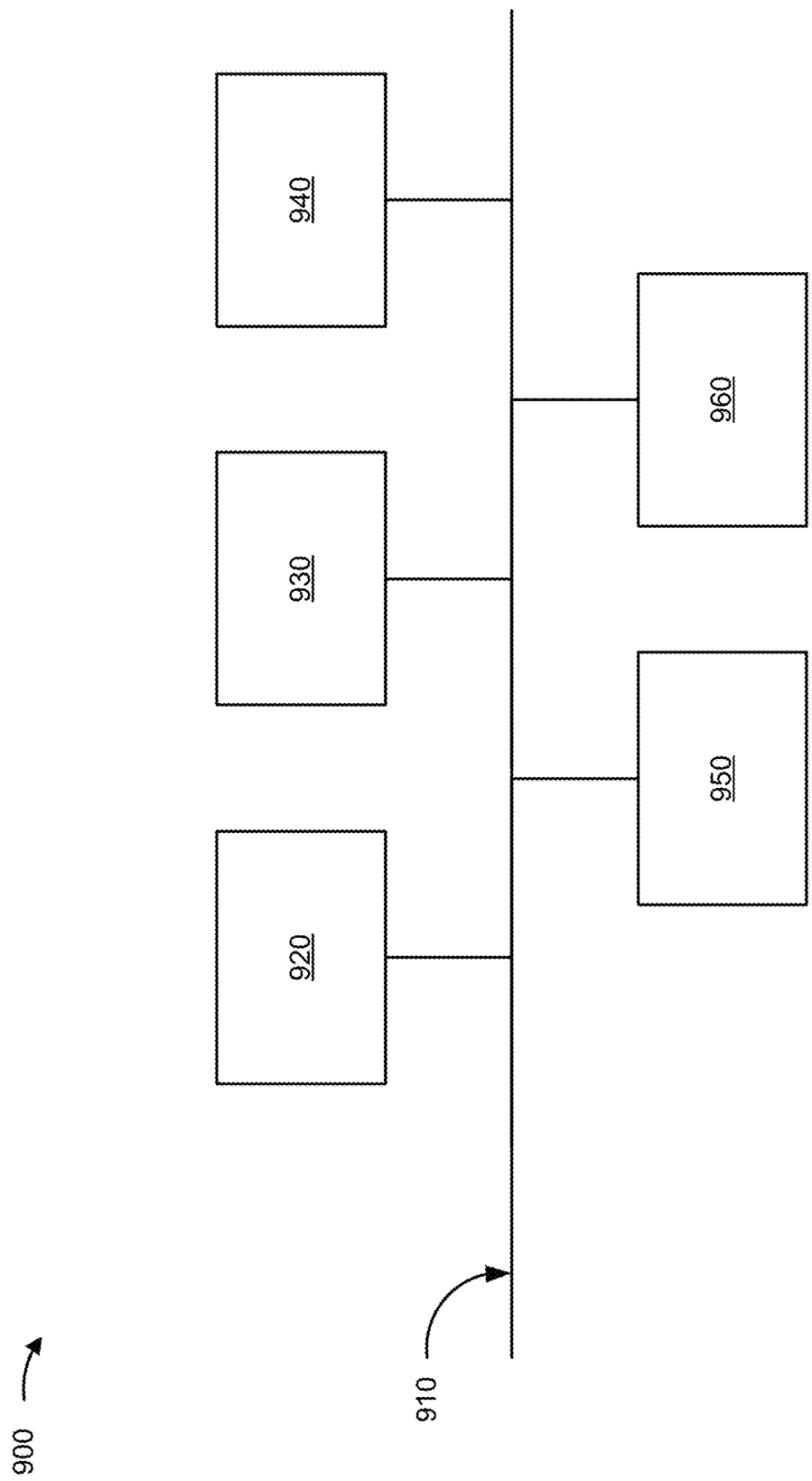
FIG. 9 is a diagram of example components of one or more devices of FIG. 1 described herein.

FIG. 9 is a diagram of example components of a device 900. In some implementations, one or more of the semiconductor processing tools 102-112 and/or the wafer/die transport tool 114 may include one or more devices 900 and/or one or more components of device 900. As shown in FIG. 9, device 900 may include a bus 910, a processor 920, a memory 930, an input component 940, an output component 950, and a communication component 960.

Bus 910 includes one or more components that enable wired and/or wireless communication among the components of device 900. Bus 910 may couple together two or more components of FIG. 9, such as via operative coupling, communicative coupling, electronic coupling, and/or electric coupling. Processor 920 includes a central processing unit, a graphics processing unit, a microprocessor, a controller, a microcontroller, a digital signal processor, a field-programmable gate array, an application-specific integrated circuit, and/or another type of processing component. Processor 920 is implemented in hardware, firmware, or a combination of hardware and software. In some implementations, processor 920 includes one or more processors capable of being programmed to perform one or more operations or processes described elsewhere herein.

Memory 930 includes volatile and/or nonvolatile memory. For example, memory 930 may include random access memory (RAM), read only memory (ROM), a hard disk drive, and/or another type of memory (e.g., a flash memory, a magnetic memory, and/or an optical memory). Memory 930 may include internal memory (e.g., RAM, ROM, or a hard disk drive) and/or removable memory (e.g., removable via a universal serial bus connection). Memory 930 may be a non-transitory computer-readable medium. Memory 930 stores information, instructions, and/or software (e.g., one or more software applications) related to the operation of device 900. In some implementations, memory 930 includes one or more memories that are coupled to one or more processors (e.g., processor 920), such as via bus 910.

Input component 940 enables device 900 to receive input, such as user input and/or sensed input. For example, input component 940 may include a touch screen, a keyboard, a keypad, a mouse, a button, a microphone, a switch, a sensor, a global positioning system sensor, an accelerometer, a gyroscope, and/or an actuator. Output component 950 enables device 900 to provide output, such as via a display, a speaker, and/or a light-emitting diode. Communication component 960 enables device 900 to communicate with other devices via a wired connection and/or a wireless connection. For example, communication component 960 may include a receiver, a transmitter, a transceiver, a modem, a network interface card, and/or an antenna.

Device 900 may perform one or more operations or processes described herein. For example, a non-transitory computer-readable medium (e.g., memory 930) may store a set of instructions (e.g., one or more instructions or code) for execution by processor 920. Processor 920 may execute the set of instructions to perform one or more operations or processes described herein. In some implementations, execution of the set of instructions, by one or more processors 920, causes the one or more processors 920 and/or the device 900 to perform one or more operations or processes described herein. In some implementations, hardwired circuitry may be used instead of or in combination with the instructions to perform one or more operations or processes described herein. Additionally, or alternatively, processor 920 may be configured to perform one or more operations or processes described herein. Thus, implementations described herein are not limited to any specific combination of hardware circuitry and software.

The number and arrangement of components shown in FIG. 9 are provided as an example. Device 900 may include additional components, fewer components, different components, or differently arranged components than those shown in FIG. 9. Additionally, or alternatively, a set of components (e.g., one or more components) of device 900 may perform one or more functions described as being performed by another set of components of device 900.

Figure 10:
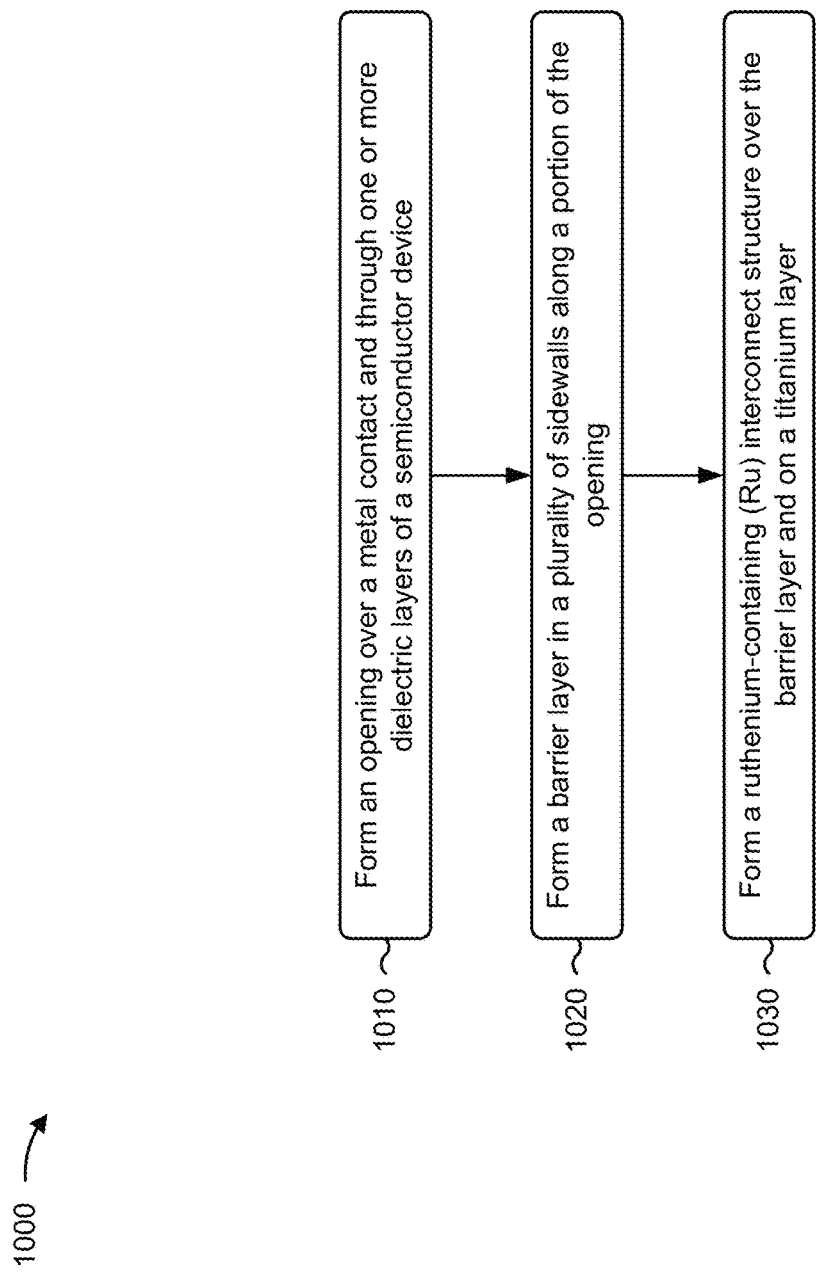
FIGS. 10 and 11 are flowcharts of example processes relating to forming an interconnect structure described herein.

FIG. 10 is a flowchart of an example process 1000 associated with forming an interconnect structure. In some implementations, one or more process blocks of FIG. 10 may be performed by one or more semiconductor processing tools (e.g., one or more semiconductor processing tools 102-112). Additionally, or alternatively, one or more process blocks of FIG. 10 may be performed by one or more components of device 900, such as processor 920, memory 930, input component 940, output component 950, and/or communication component 960.

As shown in FIG. 10, process 1000 may include forming an opening over a metal contact and through one or more dielectric layers of a semiconductor device (block 1010). For example, the one or more semiconductor processing tools 102-112 may form an opening (e.g., the opening 612) over a metal contact (e.g., the metal source/drain contact 222, the metal gate contact 802) and through one or more dielectric layers (e.g., the ESL 208, the dielectric layer 210) of the semiconductor device 200, as described above.

As further shown in FIG. 10, process 1000 may include forming a barrier layer in a plurality of sidewalls along a portion of the opening (block 1020). For example, the one or more semiconductor processing tools 102-112 may form a barrier layer (e.g., the barrier layer 228, the barrier layer 808) in a plurality of sidewalls (e.g., the sidewalls 616) along a portion of the opening (e.g., the opening 612), as described above. In some implementations, the barrier layer includes a compound containing titanium, silicon, and oxide. In some implementations, formation of the barrier layer (e.g., the barrier layer 228, the barrier layer 808) results in formation of a titanium layer (e.g., the bottom metal layer 230) on the metal contact (e.g., the metal source/drain contact 222, the metal gate contact 802). In some implementations, the barrier layer includes a titanium silicon oxide ($TiSi_xO_y$) barrier layer.

As further shown in FIG. 10, process 1000 may include forming a ruthenium-containing (Ru) interconnect structure over the barrier layer and on the titanium layer (block 1030). For example, the one or more semiconductor processing tools 102-112 may form a ruthenium-containing (Ru) interconnect structure (e.g., a source/drain interconnect structure 226, a gate interconnect structure 224) over the barrier layer (e.g., the barrier layer 228, the barrier layer 808) and on the titanium layer (e.g., the bottom metal layer 230), as described above.

Process 1000 may include additional implementations, such as any single implementation or any combination of implementations described below and/or in connection with one or more other processes described elsewhere herein.

In a first implementation, the portion of the opening includes a first portion of the opening included in a silicon oxide ($SiO_x$) layer (e.g., the first portion 616a of the sidewalls 616 corresponding to the dielectric layer 210) of the one or more dielectric layers, and the process 1000 includes forming another barrier layer (e.g., the second portion 228b of the barrier layer 228, the second portion 808b of the barrier layer 808) in the plurality of sidewalls along a second portion of the opening adjacent to the first portion, where the second portion of the opening is included in a silicon nitride ($Si_xN_y$) layer (e.g., the ESL 208), of the one or more dielectric layers, under the silicon oxide layer. The other barrier layer may include a titanium silicon nitride ($TiSi_xN_y$) barrier layer, may include a compound containing titanium, silicon, and nitride, and/or may include another type of barrier layer.

In a second implementation, alone or in combination with the first implementation, forming the other barrier layer includes providing a flow of titanium chloride ($TiCl_x$) and a hydrogen gas into the opening, where titanium of the titanium chloride and silicon nitride of the silicon nitride layer react to form titanium silicon nitride of the other barrier layer in the plurality of sidewalls along the second portion of the opening in the silicon nitride layer, and where chlorine of the titanium chloride and the hydrogen gas react to form a hydrochloric acid byproduct.

In a third implementation, alone or in combination with one or more of the first and second implementations, forming the barrier layer includes providing a flow of titanium chloride ($TiCl_x$) and a hydrogen gas into the opening, wherein titanium of the titanium chloride and silicon oxide ($SiO_x$) of a silicon oxide layer of the one or more dielectric layers react to form titanium silicon oxide of the barrier layer in the plurality of sidewalls along the portion of the opening in the silicon oxide layer, and where chlorine of the titanium chloride and the hydrogen gas react to form a hydrochloric acid byproduct. In a fourth implementation, alone or in combination with one or more of the first through third implementations, a ratio between the titanium chloride to the hydrogen gas is in a range of greater than 1:1 to approximately 1:1.25.

In a fifth implementation, alone or in combination with one or more of the first through fourth implementations, providing the flow of the titanium chloride and the hydrogen gas includes providing the flow of the titanium chloride and the hydrogen gas into a deposition chamber (e.g., a deposition chamber of the deposition tool 102), in which the semiconductor device 200 is positioned, while a temperature in the deposition chamber is in a range of approximately 350 degrees Celsius to approximately 500 degrees Celsius. In a sixth implementation, alone or in combination with one or more of the first through fifth implementations, a ratio of a width of the opening after formation of the barrier layer (e.g., the example dimension 620), and a width of the opening prior to formation of the barrier layer (e.g., the example dimension 618), is in a range of approximately 1:0.83 to approximately 1:0.973.

Although FIG. 10 shows example blocks of process 1000, in some implementations, process 1000 may include additional blocks, fewer blocks, different blocks, or differently arranged blocks than those depicted in FIG. 10. Additionally, or alternatively, two or more of the blocks of process 1000 may be performed in parallel.

Figure 11:
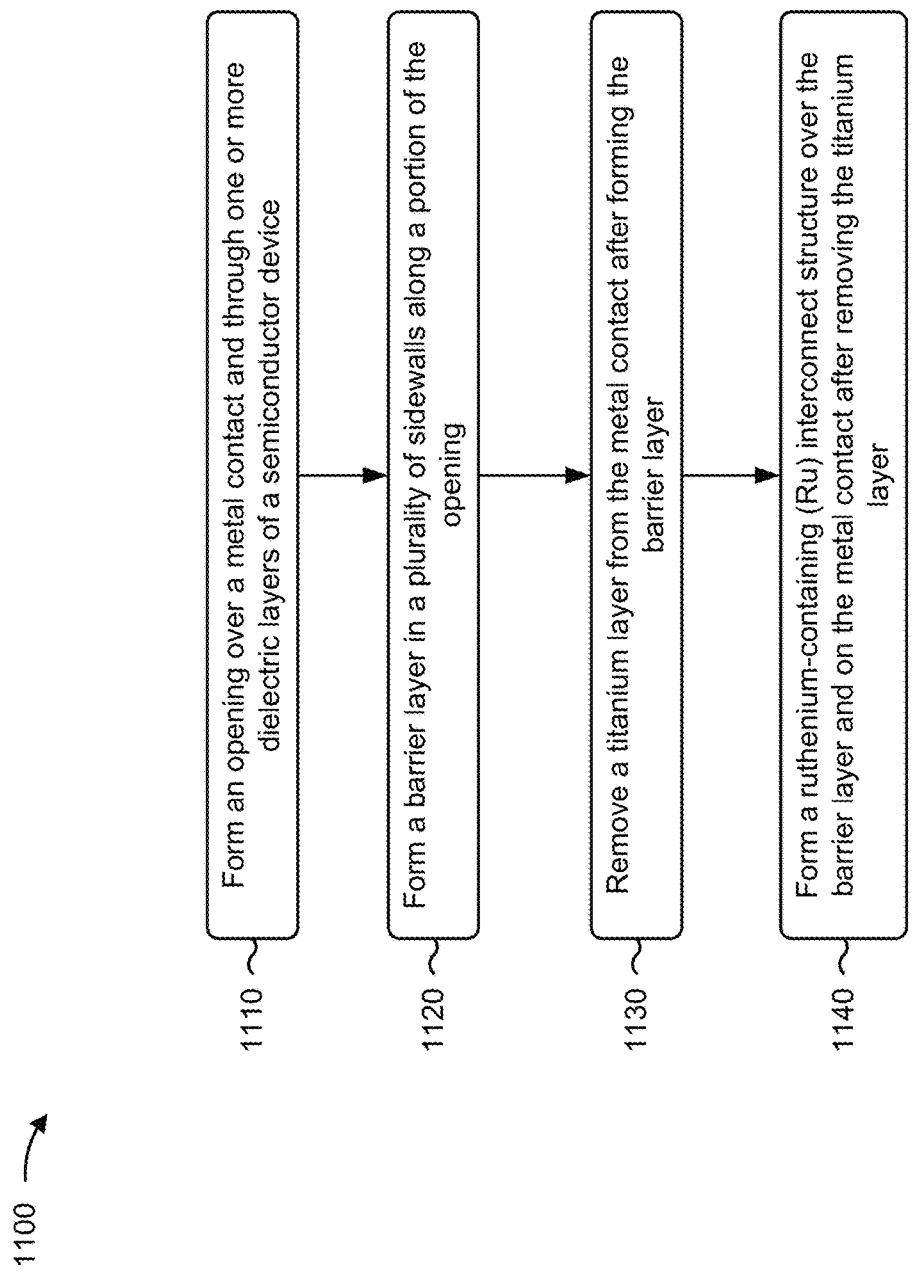

FIG. 11 is a flowchart of an example process 1100 associated with forming an interconnect structure. In some implementations, one or more process blocks of FIG. 11 may be performed by one or more semiconductor processing tools (e.g., one or more of the semiconductor processing tools 102-112). Additionally, or alternatively, one or more process blocks of FIG. 11 may be performed by one or more components of device 900, such as processor 920, memory 930, input component 940, output component 950, and/or communication component 960.

As shown in FIG. 11, process 1100 may include forming an opening over a metal contact and through one or more dielectric layers of a semiconductor device (block 1110). For example, the one or more semiconductor processing tools 102-112 may form an opening (e.g., the opening 612) over a metal contact (e.g., a metal source/drain contact 222, a metal gate contact 802) and through one or more dielectric layers (e.g., the ESL 208, the dielectric layer 210) of the semiconductor device 200, as described above.

As further shown in FIG. 11, process 1100 may include forming a barrier layer in a plurality of sidewalls along a portion of the opening, wherein formation of the titanium silicon oxide barrier layer results in formation of a titanium layer on the metal contact (block 1120). For example, the one or more semiconductor processing tools 102-112 may form a barrier layer (e.g., the barrier layer 228, the barrier layer 808) in a plurality of sidewalls (e.g., the sidewalls 616) along a portion of the opening (e.g., the opening 612), as described above. In some implementations, the barrier layer includes a compound containing titanium, silicon, and oxide. In some implementations, the barrier layer includes a titanium silicon oxide (TiSi$_x$O$_y$) barrier layer. In some implementations, formation of the barrier layer (e.g., the barrier layer 228, the barrier layer 808) results in formation of a titanium layer (e.g., the bottom metal layer 230) on the metal contact (e.g., the metal source/drain contact 222, the metal gate contact 802).

As further shown in FIG. 11, process 1100 may include removing the titanium layer from the metal contact after forming the barrier layer (block 1130). For example, the one or more semiconductor processing tools 102-112 may remove the titanium layer (e.g., the bottom metal layer 230, the bottom metal layer 810) from the metal contact (e.g., the metal source/drain contact 222, the metal gate contact 802) after forming the barrier layer (e.g., the barrier layer 228, the barrier layer 808), as described above.

As further shown in FIG. 11, process 1100 may include forming a ruthenium (Ru) interconnect structure over the barrier layer and on the metal contact after removing the titanium layer (block 1140). For example, the one or more semiconductor processing tools 102-112 may form a ruthenium (Ru) interconnect structure (e.g., the gate interconnect structure 224, the source/drain interconnect structure 226) over the barrier layer and on the metal contact after removing the titanium layer, as described above.

Process 1100 may include additional implementations, such as any single implementation or any combination of implementations described below and/or in connection with one or more other processes described elsewhere herein.

In a first implementation, removing the titanium layer includes performing a plasma etch operation using an argon (Ar) plasma to remove the titanium layer from the metal contact. In a second implementation, alone or in combination with the first implementation, forming the barrier layer includes providing a flow of titanium chloride (TiCl$_x$) and a hydrogen gas into the opening for a time duration in a range of approximately 10 seconds to approximately 80 seconds.

In a third implementation, alone or in combination with one or more of the first and second implementations, forming the barrier layer includes performing a PECVD operation to form the barrier layer, where a plasma in the PECVD operation bombards the one or more dielectric layers, which results in formation of mobilized silicon atoms in the one or more dielectric layers, and where the mobilized silicon atoms diffuse toward a surface of the one or more dielectric layers where the mobilized silicon atoms and a titanium precursor react to form the barrier layer. In a fourth implementation, alone or in combination with one or more of the first through third implementations, forming the ruthenium interconnect structure includes performing a conformal deposition operation to deposit ruthenium over the barrier layer and on the metal contact.

Although FIG. 11 shows example blocks of process 1100, in some implementations, process 1100 may include additional blocks, fewer blocks, different blocks, or differently arranged blocks than those depicted in FIG. 11. Additionally, or alternatively, two or more of the blocks of process 1100 may be performed in parallel.

In this way, a barrier layer is formed in a portion of a thickness of sidewalls in a recess prior to formation of an interconnect structure in the recess. The barrier layer is formed in the portion of the thickness of the sidewalls by a plasma-based deposition operation. In the plasma-based deposition operation, a precursor is provided onto a surface of the sidewalls. A plasma is used to cause a diffusion of silicon (Si) in the sidewalls toward the surface of the sidewalls to create a silicon-rich surface on the sidewalls. The precursor reacts with the silicon-rich surface to form the barrier layer. The barrier layer is formed in the portion of the thickness of the sidewalls in that the precursor consumes a portion of the silicon-rich surface of the sidewalls as a result of the plasma treatment. In other words, the barrier layer is formed in a portion of the sidewalls as opposed to the barrier layer being grown on top of the surface of the sidewalls. This enables the barrier layer to be formed in a manner in which the cross-sectional width reduction in the recess from the barrier layer is minimized while enabling the barrier layer to be used to promote adhesion in the recess. This reduces roughness of the interconnect structure that is formed over the barrier layer in the recess, reduces contact resistance for the interconnect structure, increases device performance, increases yield, reduces defects, and/or reduces device failures, among other examples.

As described in greater detail above, some implementations described herein provide a method. The method includes forming an opening over a metal contact and through one or more dielectric layers of a semiconductor device. The method includes forming a barrier layer in a plurality of sidewalls along a portion of the opening, where the barrier layer includes a compound containing titanium, silicon, and oxide, and where formation of the titanium silicon oxide barrier layer results in formation of a titanium layer on the metal contact. The method includes forming a ruthenium-containing (Ru) interconnect structure over the barrier layer and on the titanium layer.

As described in greater detail above, some implementations described herein provide a method. The method includes forming an opening over a metal contact and through one or more dielectric layers of a semiconductor device. The method includes forming a barrier layer in a plurality of sidewalls along a portion of the opening, where the barrier layer includes a compound containing titanium, silicon, and oxide, and where formation of the barrier layer results in formation of a titanium layer on the metal contact. The method includes removing the titanium layer from the metal contact after forming the barrier layer. The method includes forming a ruthenium-containing (Ru) interconnect structure over the barrier layer and on the metal contact after removing the titanium layer.

As described in greater detail above, some implementations described herein provide a semiconductor device. The semiconductor device includes one or more dielectric layers. The semiconductor device includes an interconnect structure included in the one or more dielectric layers. The semiconductor device includes a barrier layer between the interconnect structure and at least one of the one or more dielectric layers, where the barrier layer includes a compound containing titanium, silicon, and oxide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming an opening over a metal contact and through one or more dielectric layers of a semiconductor device;
    forming, in a deposition chamber in a range of approximately 350 degrees Celsius to approximately 500 degrees Celsius, a barrier layer in a plurality of sidewalls along a portion of the opening,
        wherein a ratio of a width of the opening after formation of the barrier layer, and a width of the opening prior to formation of the barrier layer, is in a range of approximately 1:0.83 to approximately 1:0.973, and
        wherein a titanium layer resides at a bottom of the opening and on the metal contact, wherein the plurality of sidewalls are free from the titanium layer,
            wherein a width of a bottom surface of the titanium layer is less than the width of a top surface of the metal contact; and
    forming a ruthenium-containing (Ru) interconnect structure over the barrier layer and on the titanium layer.

2. The method of claim 1,
    wherein the portion of the opening comprises a first portion of the opening included in a silicon oxide (SiOx) layer of the one or more dielectric layers; and
    wherein the method further comprises:
        forming another barrier layer in the plurality of sidewalls along a second portion of the opening adjacent to the first portion,
            wherein the other barrier layer includes a compound containing titanium, silicon, and nitride, and
            wherein the second portion of the opening is included in a silicon nitride (SixNy) layer, of the one or more dielectric layers, under the silicon oxide layer.

3. The method of claim 2,
    wherein forming the other barrier layer comprises:
        providing a flow of titanium chloride (TiClx) and a hydrogen gas into the opening,
            wherein titanium of the titanium chloride and silicon nitride of the silicon nitride layer react to form titanium silicon nitride of the other barrier layer in the plurality of sidewalls along the second portion of the opening in the silicon nitride layer, and
            wherein chlorine of the titanium chloride and the hydrogen gas react to form a hydrochloric acid byproduct.

4. The method of claim 1,
    wherein forming the barrier layer comprises:
        providing a flow of titanium chloride (TiClx) and a hydrogen gas into the opening,
            wherein titanium of the titanium chloride and silicon oxide (SiOx) of a silicon oxide layer of the one or more dielectric layers react to form titanium silicon oxide of the barrier layer in the plurality of sidewalls along the portion of the opening in the silicon oxide layer, and
            wherein chlorine of the titanium chloride and the hydrogen gas react to form a hydrochloric acid byproduct.

5. The method of claim 4,
    wherein a ratio between the titanium chloride to the hydrogen gas is in a range of greater than 1:1 to approximately 1:1.25.

6. The method of claim 1,
    wherein the barrier layer and the Ru interconnect structure resides above a top surface of the metal contact.

7. The method of claim 1, further comprising:
    removing the Ru interconnect structure and the titanium layer; and
    forming, after removing the Ru interconnect structure, a second Ru interconnect structure over the barrier layer, into the opening, and onto the metal contact.

8. The method of claim 7, wherein removing the Ru interconnect structure and the titanium layer comprises:
    removing the Ru interconnect structure; and
    removing, after removing the Ru interconnect structure, the titanium layer.

9. A method, comprising:
    forming an opening over a metal contact and through one or more dielectric layers of a semiconductor device;
    forming, in a deposition chamber in a range of approximately 350 degrees Celsius to approximately 500 degrees Celsius, a barrier layer in a plurality of sidewalls along a portion of the opening, wherein a titanium layer resides on the metal contact, wherein a bottom surface of the titanium layer resides above a top most surface of the metal contact, wherein a width of a bottom surface of the titanium layer is less than the width of a top surface of the metal contact;

removing the titanium layer from the metal contact after forming the barrier layer; and forming a ruthenium-containing (Ru) interconnect structure over the barrier layer and on the metal contact after removing the titanium layer.

10. The method of claim 9,
wherein removing the titanium layer comprises:
performing a plasma etch operation using an argon (Ar) plasma to remove the titanium layer from the metal contact.

11. The method of claim 9,
wherein forming the barrier layer comprises:
providing a flow of titanium chloride (TiClx) and a hydrogen gas into the opening for a time duration in a range of approximately 10 seconds to approximately 80 seconds.

12. The method of claim 9,
wherein forming the barrier layer comprises:
performing a plasma enhanced chemical vapor deposition (PECVD) operation to form the barrier layer,
wherein a plasma in the PECVD operation bombards the one or more dielectric layers, which results in formation of mobilized silicon atoms in the one or more dielectric layers, and
wherein the mobilized silicon atoms diffuse toward a surface of the one or more dielectric layers where the mobilized silicon atoms and a titanium precursor react to form the barrier layer.

13. The method of claim 9,
wherein forming the ruthenium interconnect structure comprises:
performing a conformal deposition operation to deposit ruthenium over the barrier layer and on the metal contact.

14. The method of claim 9, wherein the Ru interconnect structure is a first Ru interconnect structure, and the method further comprising:
forming, after forming the barrier layer, a second Ru interconnect structure over the barrier layer and the titanium layer; and
removing the second Ru interconnect structure,
wherein removing the titanium layer is after removing the second Ru interconnect structure, and
wherein forming the first Ru interconnect structure is after removing the titanium layer.

15. A method, comprising:
forming an opening, in at least a dielectric layer, over a metal source/drain contact, wherein the opening has angled sidewalls;
forming, using a plasma-based deposition operation in a deposition chamber in a range of approximately 350 degrees Celsius to approximately 500 degrees Celsius, a barrier layer in the angled sidewalls,
wherein a ratio of a width of the opening after formation of the barrier layer, and a width of the opening prior to formation of the barrier layer, is in a range of approximately 1:0.83 to approximately 1:0.973, and
wherein a metal layer resides on the metal source/drain contact, wherein the angled sidewalls are free from the metal layer; and
forming, after forming the barrier layer, an interconnect structure in the opening and on the barrier layer.

16. The method of claim 15,
wherein forming the barrier layer comprises:
providing a precursor onto the angled sidewalls over the metal source/drain contact, wherein the precursor consumes a portion of a surface of the angled sidewalls.

17. The method of claim 16,
wherein the precursor comprises titanium and gas.

18. The method of claim 15, further comprising:
forming the metal layer over the metal source/drain contact,
wherein the interconnect structure is formed on the metal layer.

19. The method of claim 15,
wherein a bottom width of the interconnect structure is less than at least one of: a top width of the interconnect structure or a top width of the metal source/drain contact.

20. The method of claim 15, wherein the interconnect structure is a first interconnect structure, and the method further comprising:
forming, after forming the barrier layer, a second interconnect structure over the barrier layer and the metal layer;
removing the second interconnect structure; and
removing, after removing the second interconnect structure, the metal layer,
wherein forming the first interconnect structure is after removing the metal layer.

* * * * *